(12) United States Patent
Huang et al.

(10) Patent No.: US 12,191,371 B2
(45) Date of Patent: Jan. 7, 2025

(54) FIELD EFFECT TRANSISTOR WITH DISABLED CHANNELS AND METHOD

(71) Applicant: Taiwan Semiconductor Manufacturing Co., Ltd., Hsinchu (TW)

(72) Inventors: Yu-Xuan Huang, Hsinchu (TW); Hou-Yu Chen, Hsinchu (TW); Jin Cai, Hsinchu (TW); Zhi-Chang Lin, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 356 days.

(21) Appl. No.: 17/736,036

(22) Filed: May 3, 2022

(65) Prior Publication Data

US 2023/0134741 A1    May 4, 2023

Related U.S. Application Data

(60) Provisional application No. 63/275,708, filed on Nov. 4, 2021.

(51) Int. Cl.
*H01L 29/423* (2006.01)
*H01L 21/22* (2006.01)
*H01L 29/06* (2006.01)
*H01L 29/66* (2006.01)

(52) U.S. Cl.
CPC ........ *H01L 29/42392* (2013.01); *H01L 21/22* (2013.01); *H01L 29/0665* (2013.01); *H01L 29/66545* (2013.01)

(58) Field of Classification Search
CPC .............. H01L 29/42392; H01L 21/22; H01L 29/0665; H01L 29/66545; H01L 29/0673; H01L 29/0847; H01L 29/1079; H01L 29/41766; H01L 29/66439; H01L 29/165; H01L 29/775; H01L 29/7848; H01L 29/78696; B82Y 10/00
See application file for complete search history.

(56) References Cited

U.S. PATENT DOCUMENTS

2010/0155827 A1* 6/2010 Kim ................ H01L 29/66787
257/327

FOREIGN PATENT DOCUMENTS

TW          202129749 A       8/2021

\* cited by examiner

*Primary Examiner* — J. E. Schoenholtz
(74) *Attorney, Agent, or Firm* — Seed IP Law Group

(57) ABSTRACT

A device includes a vertical stack of semiconductor nanostructures, a gate structure, a first epitaxial region and a dielectric structure. The gate structure wraps around the semiconductor nanostructures. The first epitaxial region laterally abuts a first semiconductor nanostructure of the semiconductor nanostructures. The dielectric structure laterally abuts a second semiconductor nanostructure of the semiconductor nanostructures and vertically abuts the first epitaxial region.

20 Claims, 23 Drawing Sheets

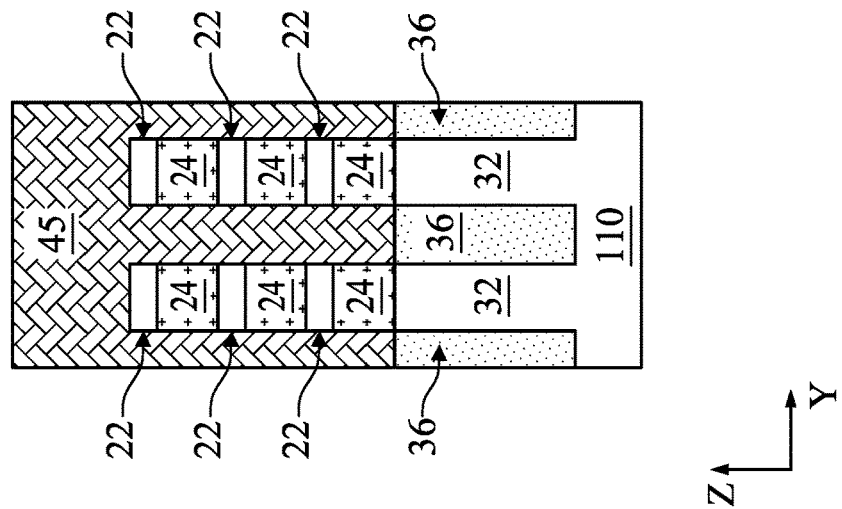
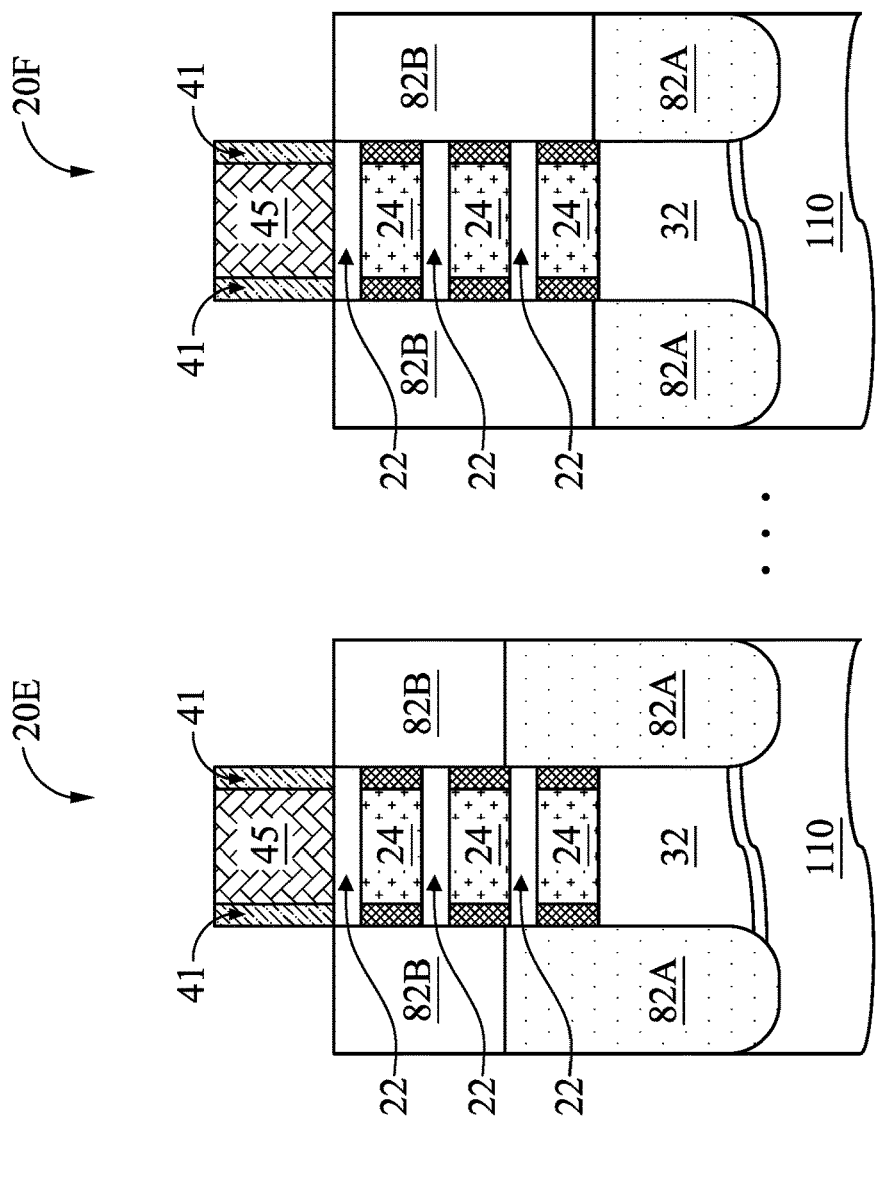
FIG. 4B
FIG. 4A

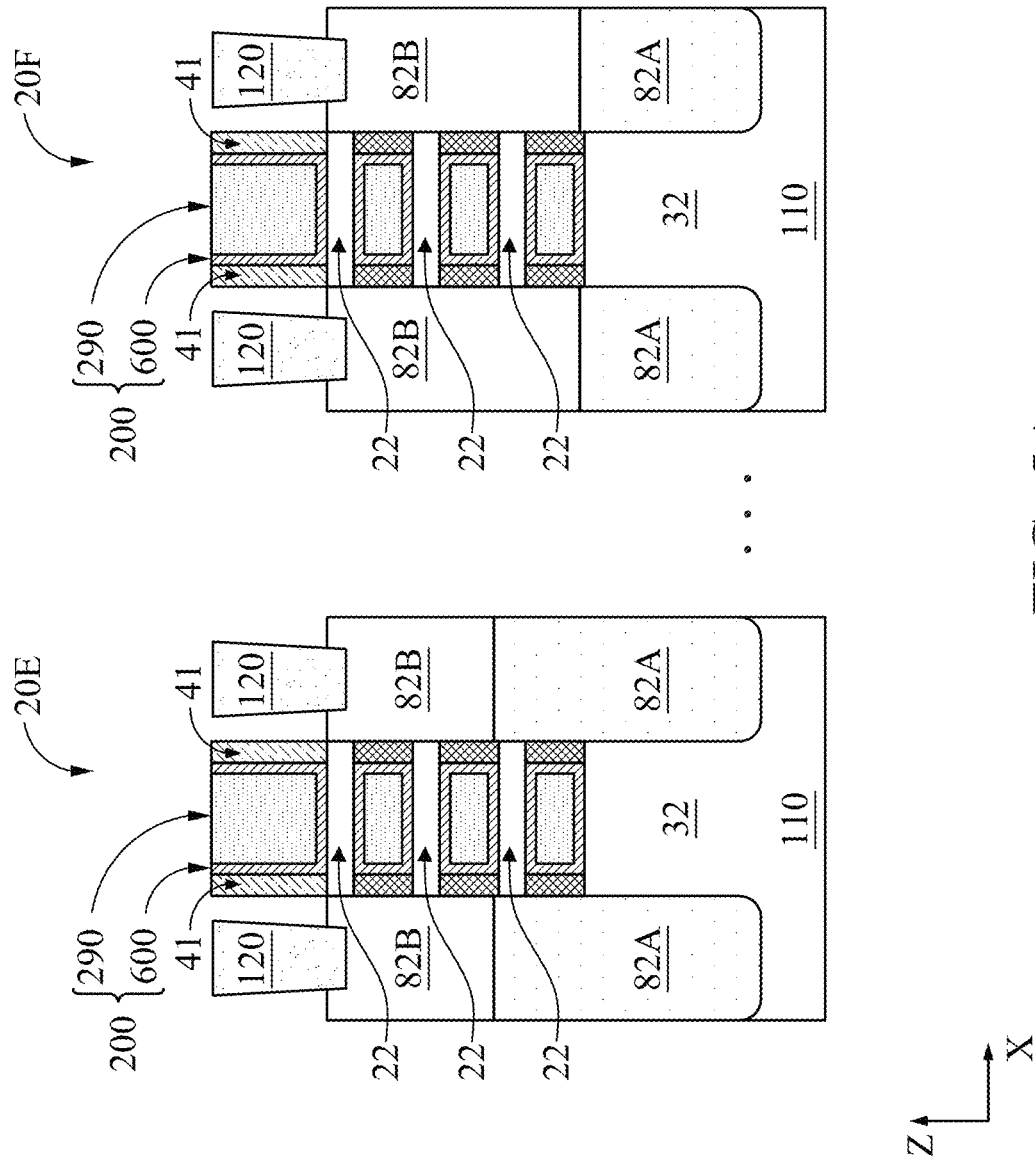
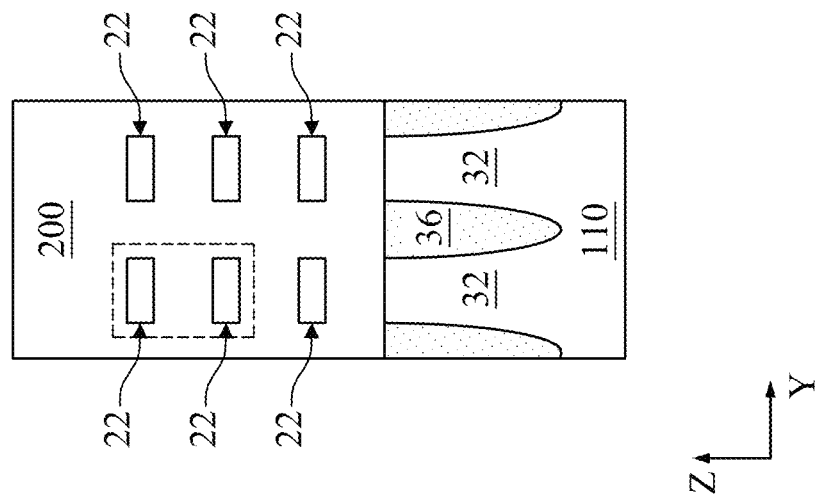
FIG. 5A
FIG. 5B

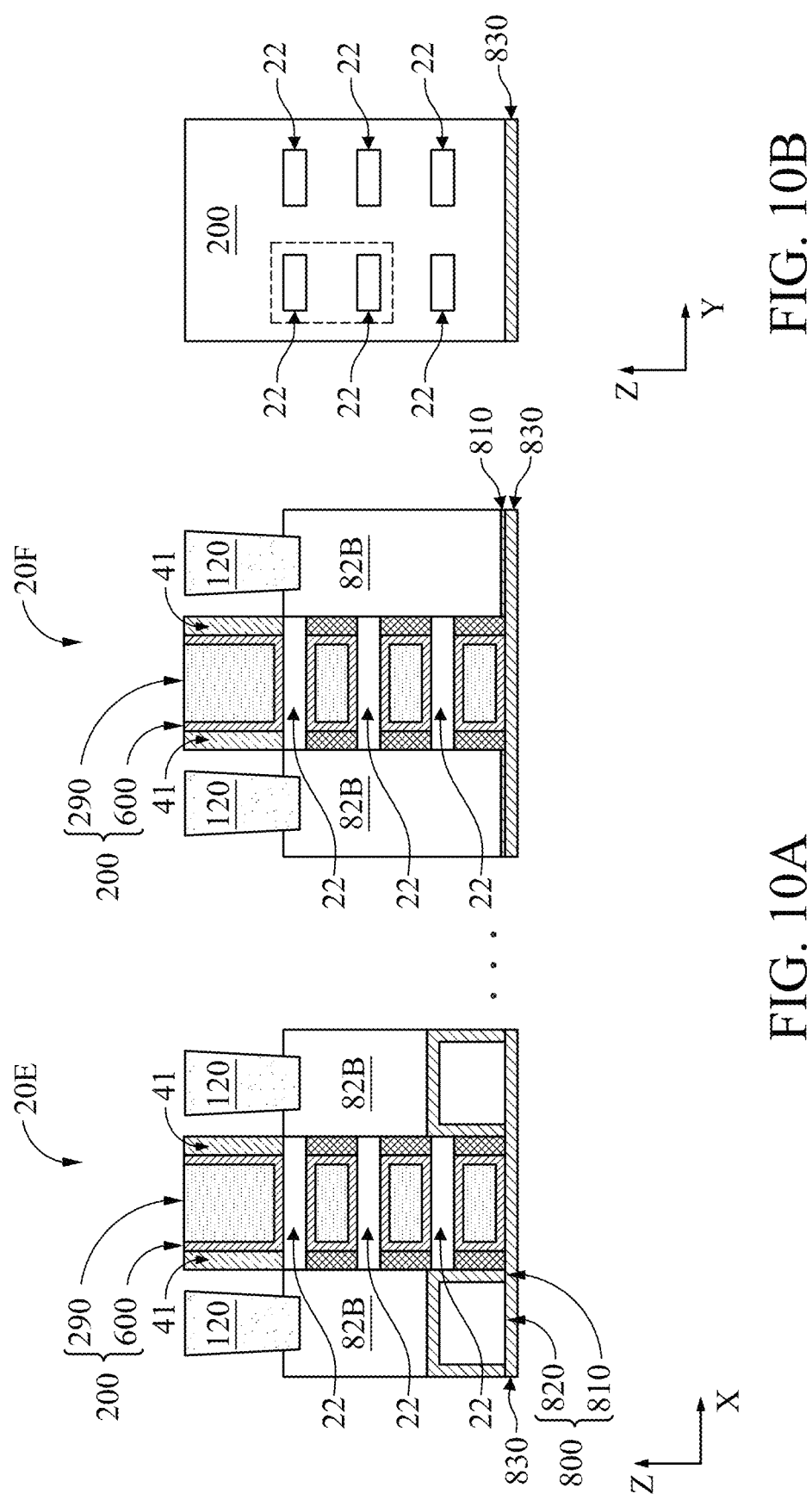

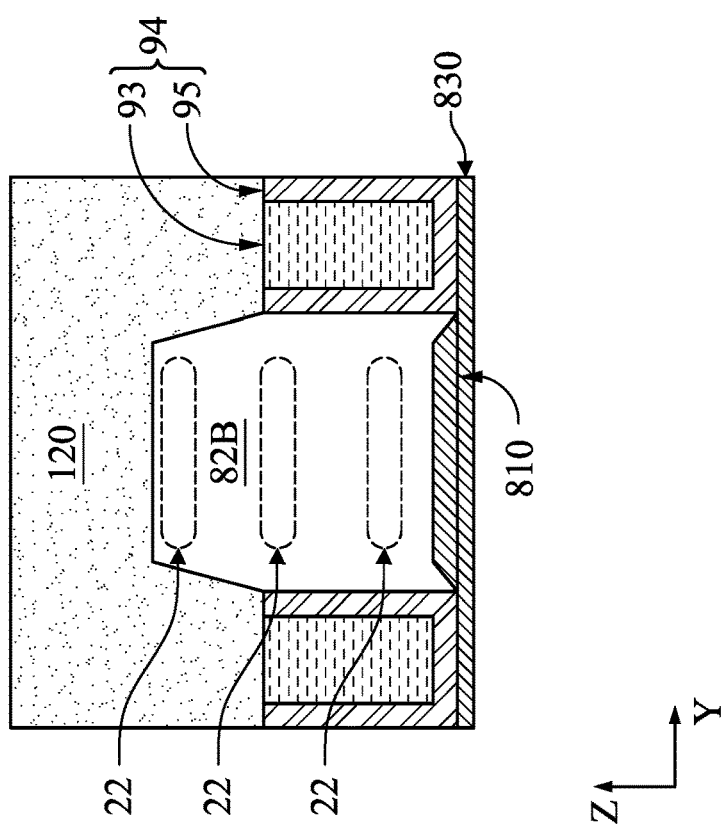
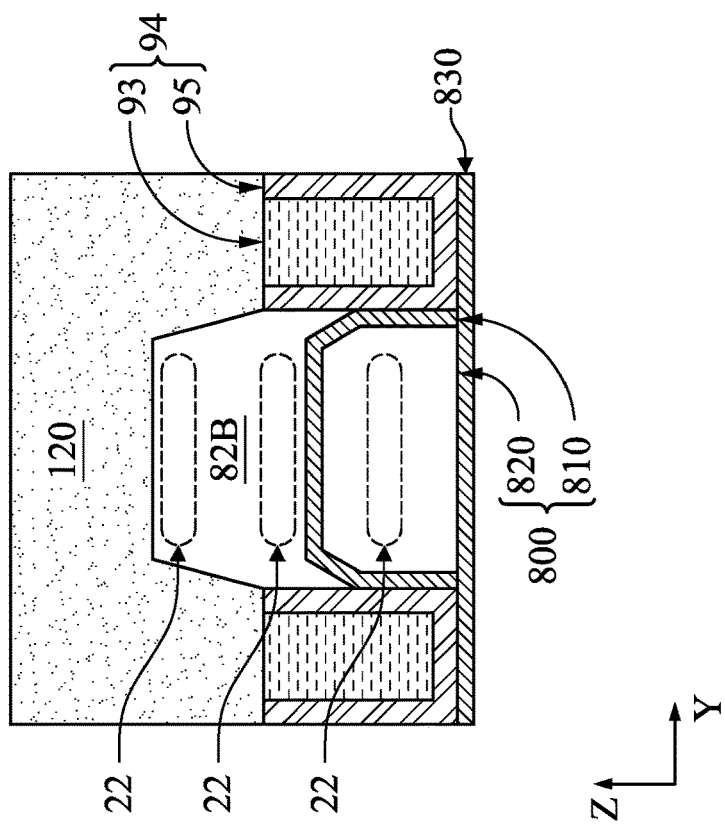
FIG. 10D
FIG. 10C

FIELD EFFECT TRANSISTOR WITH DISABLED CHANNELS AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B, 3A-3B, 4A-4D, 5A-5D, 6A-6D, 7A-7D, 8A-8D, 9A-9D and 10A-10D are views of an IC device of at various stages of fabrication according to various aspects of the present disclosure.

DETAILED DESCRIPTION

Figure 1A:
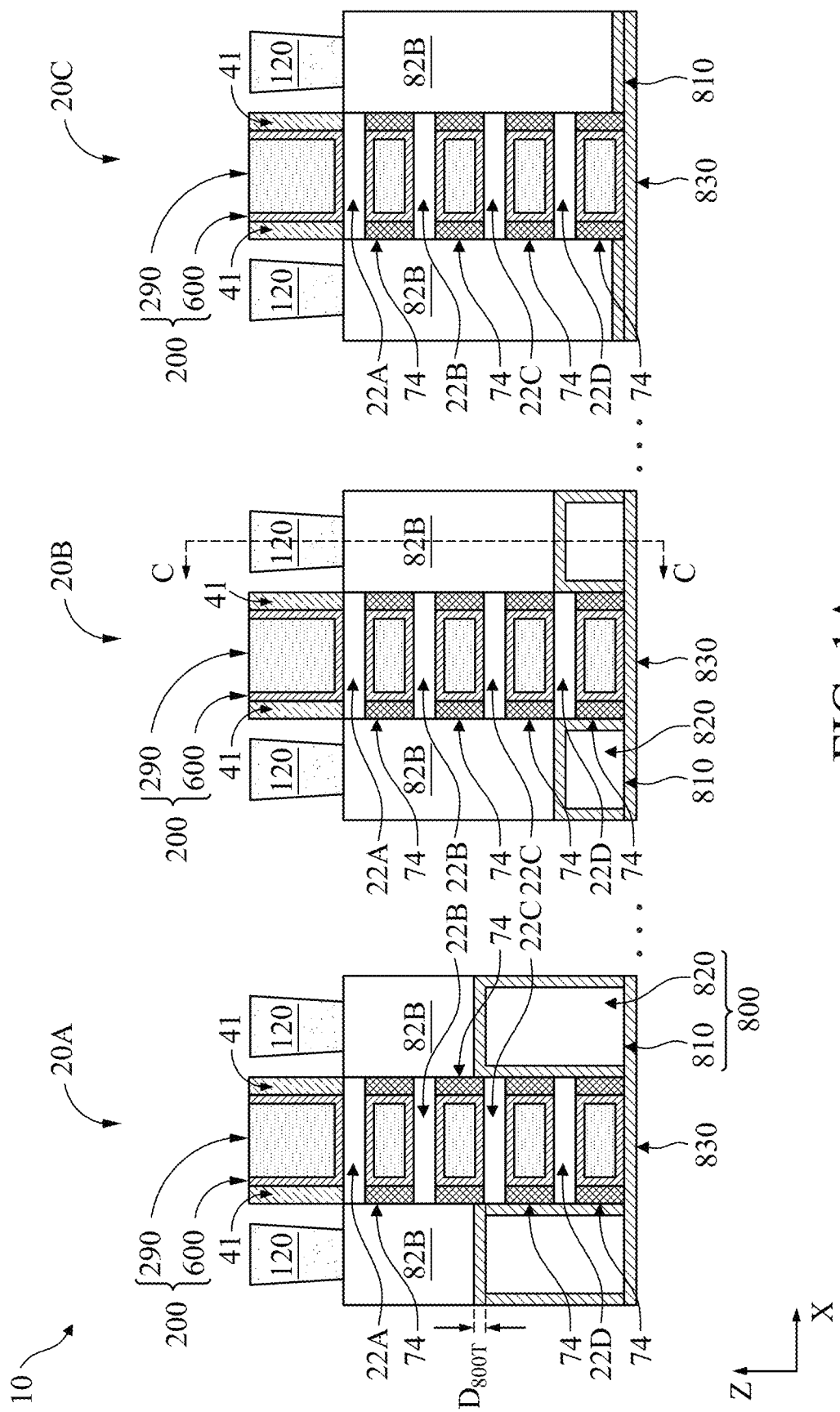
FIGS. 1A-1D are diagrammatic perspective and cross-sectional side views of a portion of an IC device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Such terms may be process- and/or equipment-dependent, and should not be interpreted as more or less limiting than a person having ordinary skill in the art would recognize as normal for the technology under discussion.

The present disclosure is generally related to semiconductor devices, and more particularly to field-effect transistors (FETs), such as planar FETs, three-dimensional fin-line FETs (FinFETs), or nanostructure devices (e.g., gate-all-around FETs (GAAFETs), nanosheet FETs (NSFETs), nanowire FETs (NWFETS) and the like). On a semiconductor wafer (or "wafer") used in the fabrication of many integrated circuit (IC) chips or dies, number of sheets is limited (e.g., fixed) on the same wafer for different designs because the same process is common across all dies on the wafer. To achieve structures having good performance across a range of designs, it may be beneficial for sheets to be depopulated (e.g., reduced in number) for low-power design and increased for high-speed design.

Conventional sheet depopulation may be accomplished by use of a bottom dielectric that separates a lower epitaxial region from an upper epitaxial region, thereby disabling sheets below the bottom dielectric that are coupled to the lower epitaxial region. However, P-FET performance is affected in such approaches due to a reduction or elimination of epitaxial stress. To mitigate this effect, depopulation may be performed on N-FET regions without performing depopulation on P-FET regions. Such approaches may also suffer from formation of dislocations (or voids) in the upper epitaxial region, due to it being grown on the bottom dielectric, which may further act to reduce stress and thereby reduce performance. In addition, a stress effect from the substrate to the upper sheets is blocked by the bottom dielectric.

Embodiments of the disclosure provide a solution that achieves sheet depopulation on the same wafer or same die in both N-FET and P-FET regions without P-FET stress loss. In the embodiments, a bottom dielectric is formed from a backside of the wafer for sheet depopulation. As such, stress loss is reduced, and different devices may have different numbers of enabled (or disabled) sheets.

The nanostructure (e.g., gate all around) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used, for example, to pattern the GAA structure.

Figure 1B:
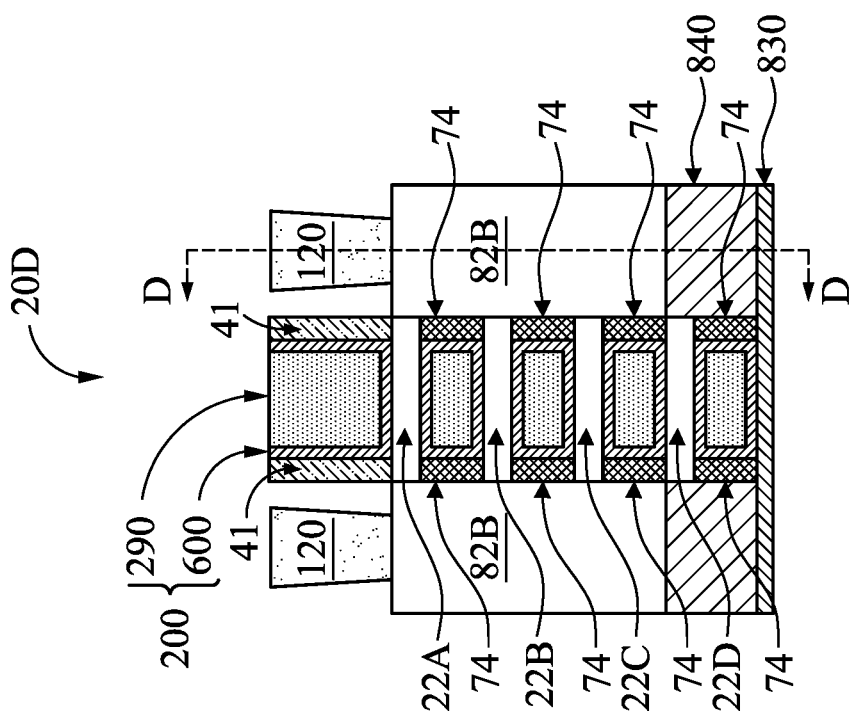
Figure 1C:
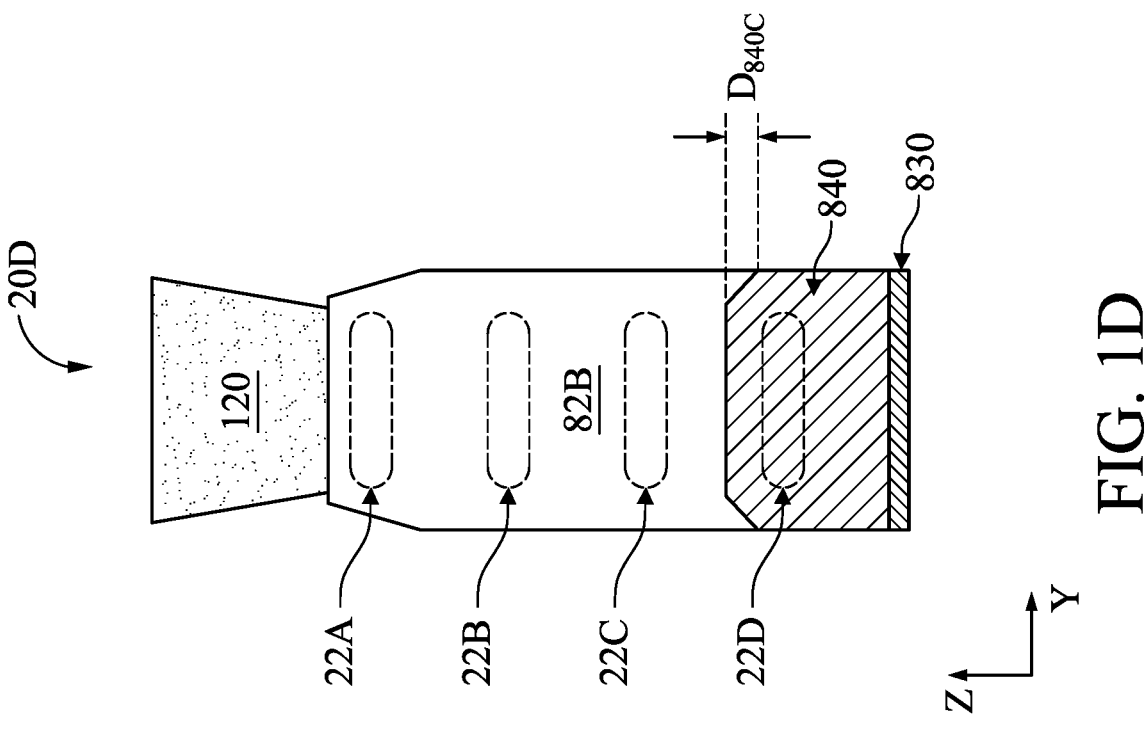
Figure 1D:
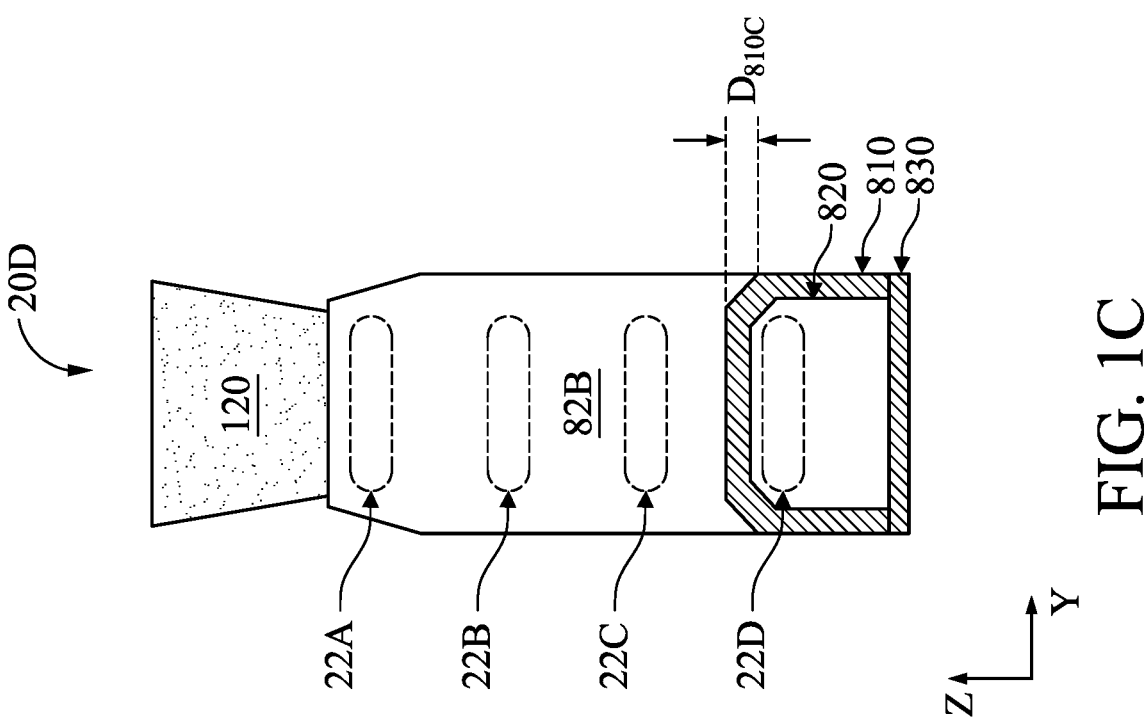

FIGS. 1A-1D illustrate diagrammatic cross-sectional side views of a portion of an IC device 10 fabricated according to embodiments of the present disclosure, where the IC device 10 includes nanostructure devices 20A-20C and/or nanostructure device 20D. The nanostructure devices 20A-20D may be GAAFETs, NSFETs, NWFETs, or the like, and may be referred to as nanostructure devices throughout. FIG. 1C is a cross-sectional side view of a portion of the nanostructure device 20B along the line C-C shown in FIG. 1A. FIG. 1D is a cross-sectional side view of a portion of the nanostructure device 20D along the line D-D shown in FIG. 1B. Certain features may be removed from view in the cross-sectional views of FIGS. 1A-1D for simplicity of illustration.

IC devices 10 may include at least an N-type FET (NFET) or a P-type FET (PFET), in some embodiments. Integrated circuit devices such as the IC device 10, in addition to including NFETs and PFETs, also frequently include transistors having different performance (e.g., threshold voltage) based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different performance levels.

In the example shown in FIG. 1A, the IC device 10 includes a first nanostructure device 20A having a first performance level, a second nanostructure device 20B having a second performance level, and a third nanostructure device 20C having a third performance level. For example, the first nanostructure device 20A has two active channels 22A, 22B and two disabled channels 22C, 22D. The second nanostructure device 20B has three active channels 22A-22C and one disabled channel 22D. The third nanostructure device 20C has four active channels 22A-22D and no disabled channels. As such, the first nanostructure device 20A may have lower power consumption than the second nanostructure device 20B, which may in turn have lower power consumption than the third nanostructure device 20C. The third nanostructure device 20C may have higher speed than the second nanostructure device 20B, which may in turn have higher speed than the first nanostructure device 20A.

In some embodiments, low-power devices include more disabled channels 22 than high-speed devices. For example, the first nanostructure device 20A may be a low-power device, and the second nanostructure device 20B and the third nanostructure device 20C may be high-speed devices. Generally, a nanostructure device configured as a decoupling capacitor includes the same number of or more active channels 22 (e.g., four or more active channels 22) than a nanostructure device configured as a high-speed device or SRAM pass gate (e.g., three to four active channels 22), which includes the same or more active channels 22 than a nanostructure device configured as a low-speed device (e.g., two to three active channels 22).

The nanostructure devices 20A-20C may be formed over and/or in a substrate 110 (see FIG. 2A), and generally includes gate structure 200 straddling and/or wrapping around semiconductor channels 22A, 22B, 22C, 22D, alternately referred to as "nanostructures," located over semiconductor fins 32 protruding from, and separated by, isolation regions 36 (e.g., shallow trench isolation, or "STI," regions). The semiconductor channels 22A-22D may be referred to collectively as the channels 22. The gate structure 200 controls electrical current flow through the channels 22. In some embodiments, the substrate 110 is not present in the IC device 10, for example, when the substrate 110 is removed during backside processing. In some embodiments, the fin structure 32 (see FIG. 2A) includes silicon. The fin structure 32 may not be present, as shown in FIG. 1A, for example, when the fin structure 32 is removed in backside processing.

The cross-sectional view of the IC device 10 in FIG. 1A is taken along an X-Z plane, where the X-axis direction is the horizontal direction, and the Z-axis direction is the vertical direction. In FIG. 1A, the nanostructure devices 20A-20C are shown including four channels 22A-22D, which are laterally abutted by source/drain features 82B (or "upper source/drain features 82B"), and covered and surrounded by respective gate structures 200. Generally, the number of channels 22 is four (as shown in FIG. 1A), but may be less than four (e.g., two or three) or more than four (e.g., five, eight or the like). The gate structure 200 controls flow of electrical current through the channels 22A-22D to and from the source/drain features 82B based on voltages applied at the gate structure 200 and at the source/drain features 82B.

The channel 22D is nearer the substrate 110 than the channel 22C, which is nearer than the channel 22B, which is nearer than the channel 22A. The channel 22A may be referred to as a topmost or uppermost channel 22A, and may be the channel 22A most distal the substrate 110 in a stack of channels 22. The channel 22D (in the case of four channels) may be referred to as a bottommost channel 22D, and may be the channel 22D most proximal the substrate 110 in the stack of channels 22. The channel 22D is between the channel 22A and the substrate 110.

In some embodiments, the nanostructure devices 20A-20C are NFETs, and the source/drain features 82B thereof include silicon phosphorous (SiP). In some embodiments, the nanostructure devices 20A-20C are PFETs, and the source/drain features 82B thereof include silicon germanium (SiGe). It should be appreciated that a number of semiconductive materials are suitable for the source/drain features 82B, and N-type or P-type may be determined based on a base semiconductive material of the source/drain feature 82B, based on a dopant type, based on a dopant concentration, or based on a combination thereof.

The source/drain features 82B may have different size in different nanostructure devices, as shown in FIG. 1A. For example, the source/drain feature 82B of the nanostructure device 20C extends deeper (e.g., has greater height in the Z-axis direction) than that of the nanostructure device 20B, which extends deeper (e.g., has greater height in the Z-axis direction) than that of the nanostructure device 20A. As such, the source/drain feature 82B abuts two channels 22 in the nanostructure device 20A, three channels 22 in the nanostructure device 20B, and four channels 22 in the nanostructure device 20C.

Dielectric structures 800 abut the source/drain features 82B, the channels 22, and inner spacers 74. Channels 22 abutted by the dielectric structures 800 instead of the source/drain features 82B are disabled or deactivated. For example, in the nanostructure device 20A, two channels 22C, 22D are disabled. In the nanostructure device 20B, one channel 22D is disabled. In the nanostructure device 20C, no channels are disabled. In some embodiments, the dielectric structures 800 extend to a level above the topmost disabled channel by a distance $D_{800T}$ that is greater than about 2 nm, such as in a range from about 2 nm to about 5 nm. The dielectric structure 800 introduces isolation between the disabled channels 22 and the source/drain feature 82B. For example, the dielectric structures 800 of the nanostructure device 20A isolate the disabled channels 22C, 22D from the source/drain features 82B. As such, when the separation between the source/drain features 82B (e.g., the distance $D_{800T}$) is less than about 2 nm, bridging or a leakage path between the disabled channel 22C and the source/drain features 82B may occur, leading to the channel 22C being unintentionally enabled, thereby changing performance of the nanostructure device 20A. When the distance $D_{800T}$ is greater than the separation between the channels 22, the dielectric structures 800 may abut one of the active channels 22. For example, in the nanostructure device 20A, when the distance $D_{800T}$ is greater than the separation between the channel 22C and the channel 22B, the dielectric structures 800 abut (e.g., partially abut) the channel 22B, which reduces contact area between ends of the channel 22B and the source/drain features 82B. As such, the channel 22B may be inadvertently disabled, or partially disabled, causing a change in performance of the nanostructure device 20A. In some embodiments, the distance $D_{800T}$ is substantially zero or zero, as shown in FIG. 1B.

In some embodiments, the dielectric structure 800 includes a liner layer 810 and a core layer 820. The liner layer 810 may be or include a dielectric material, such as a low-k dielectric material, such as SiO, SiOCN, SiON, SiN, or the like. In some embodiments, the liner layer 810 is a nitrogen-containing dielectric material, such as SiN, SiOCN or the like. Thickness of the liner layer 810 may be in a range of about 3 nm to about 5 nm. The core layer 820 is laterally surrounded by the liner layer 810, and is or includes a dielectric material, such as a low-k dielectric material, such as SiO, SiOCN, SiON, SiN, or the like. In some embodiments, the liner layer 810 includes a different material than the core layer 820. In cross-section (e.g., in the X-Z plane), the liner layer 810 has an inverted U shape profile, in some embodiments, as shown in FIG. 1A. The liner layer 810 may have cross-sectional profile that is a horizontal line shape instead of the inverted U shape, for example, in the nanostructure device 20C that does not include disabled channels 22. In some embodiments, the liner layer 810 is not present in the nanostructure device 20C, and is instead removed completely, for example, in backside processing.

FIG. 1B shows an embodiment in which the liner layer 810 and the core layer 820 are not present, and instead a dielectric block 840 is included as the dielectric structure 800. The dielectric block 840 may be or include a dielectric material, such as a low-k dielectric material, such as SiO, SiOCN, SiON, SiN, or the like. The dielectric block 840 may extend vertically (e.g., in the Z-axis direction) from a first horizontal plane shared by lower surfaces of the gate structure 200 and the inner spacers 74 to a second horizontal plane at a level between the lower surface of the uppermost channel 22A and slightly above the first horizontal plane. For example, as shown in FIG. 1B, the second horizontal plane may be at an interface between the upper surface of the lowermost channel 22D and the gate structure 200. In the example of FIG. 1B, the lowermost channel 22D is disabled due to being abutted by the dielectric block 840 instead of the source/drain feature 82B.

Figure 4D:
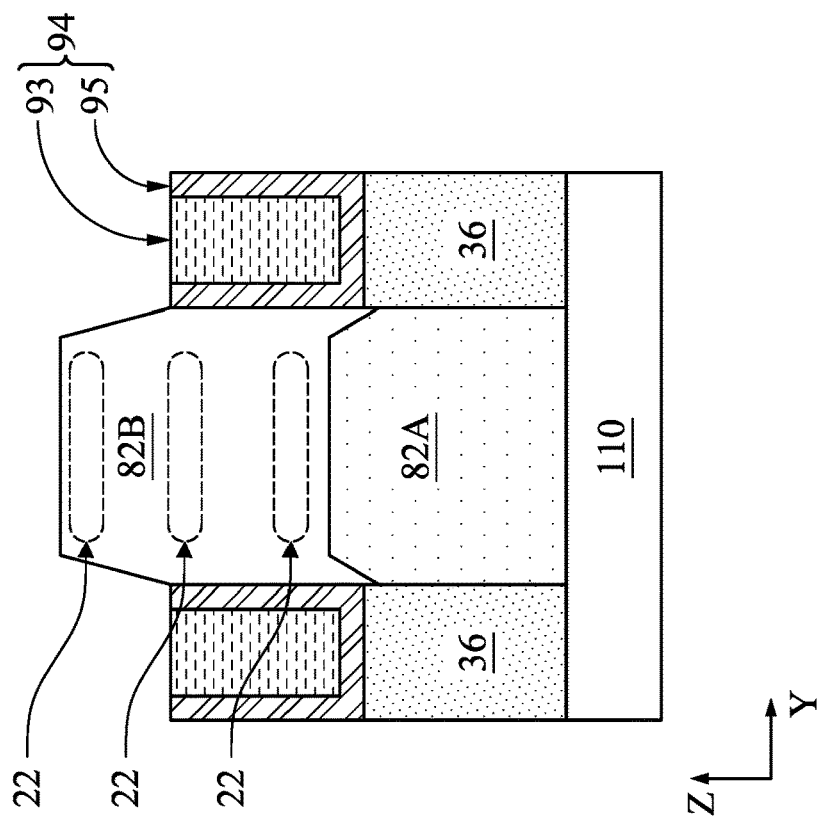
Figure 4C:
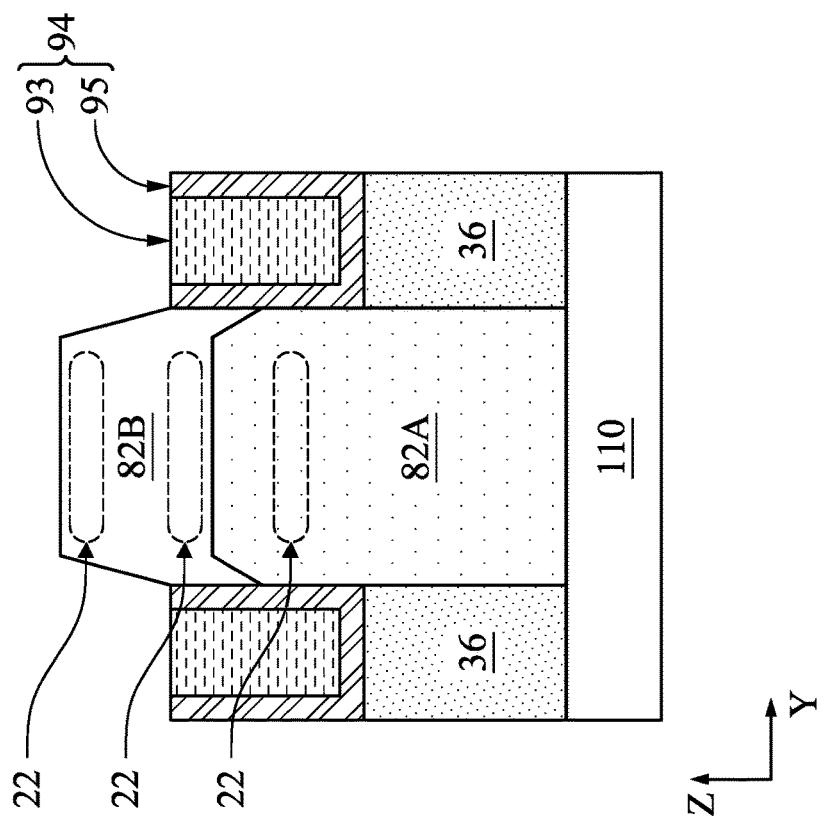
Figure 5C:
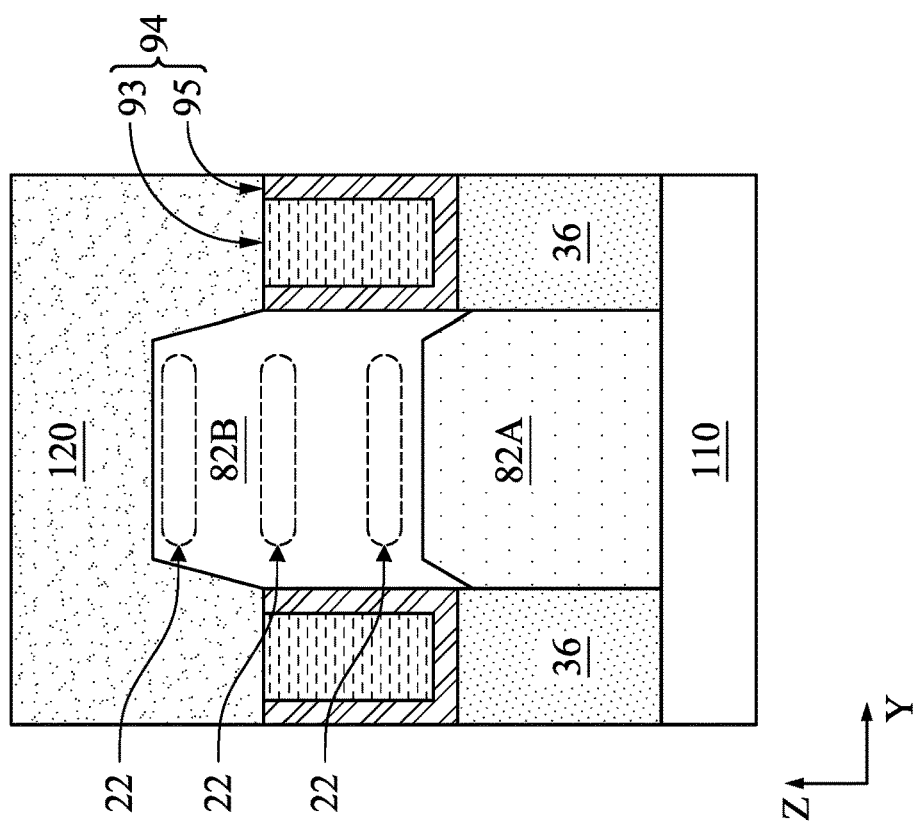
Figure 5D:
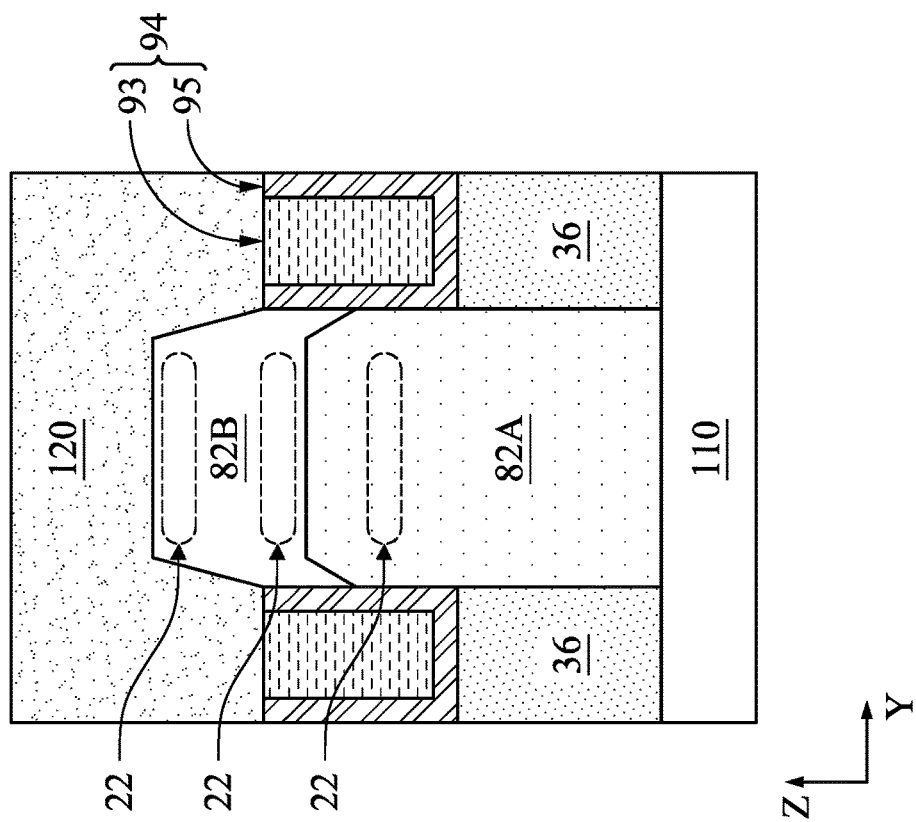
Figure 6A:
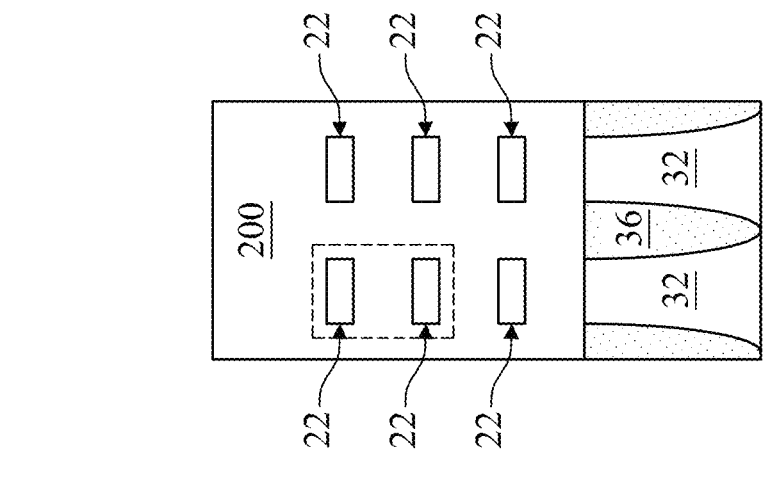
Figure 6A:
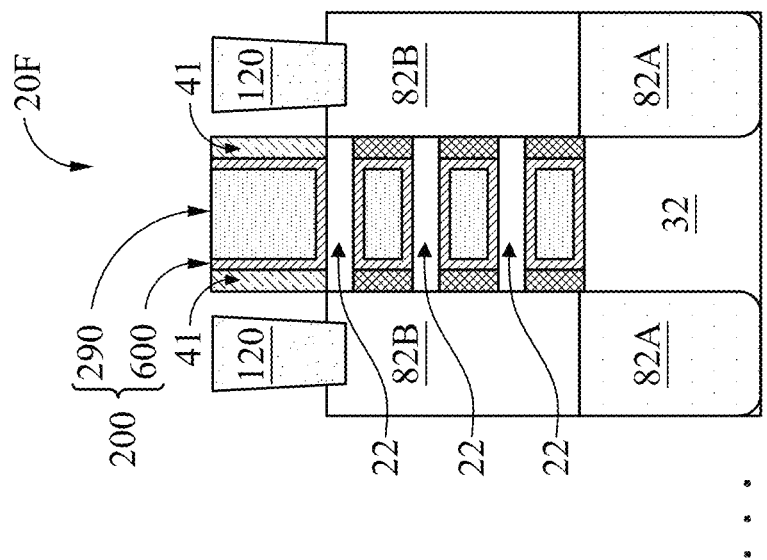
Figure 6B:
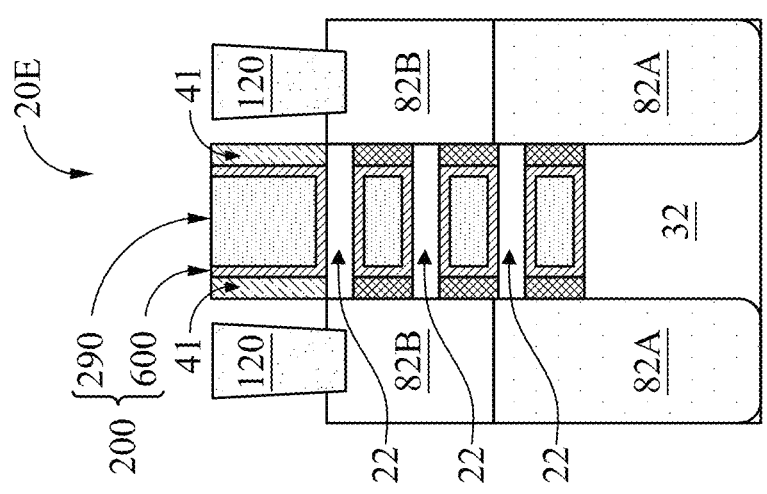
Figure 6C:
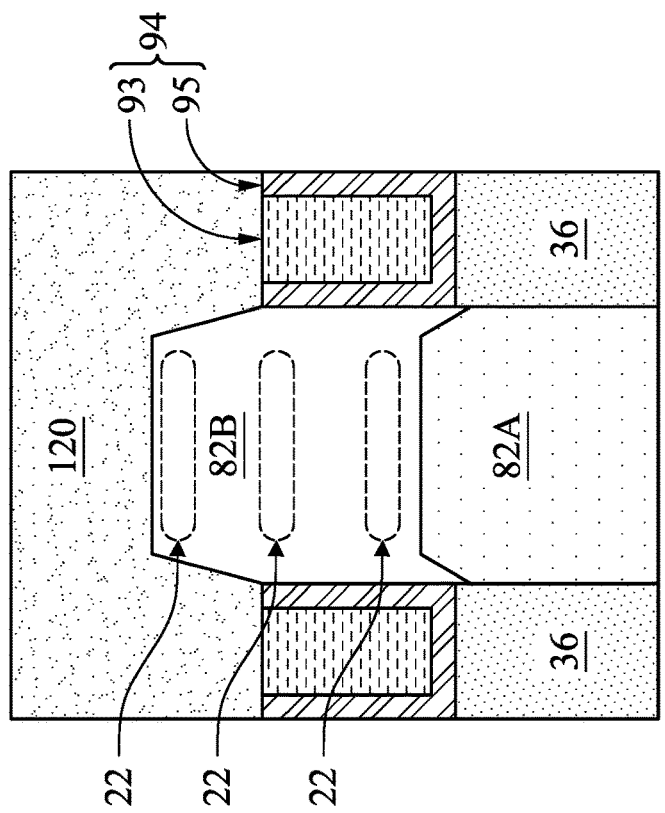
Figure 6D:
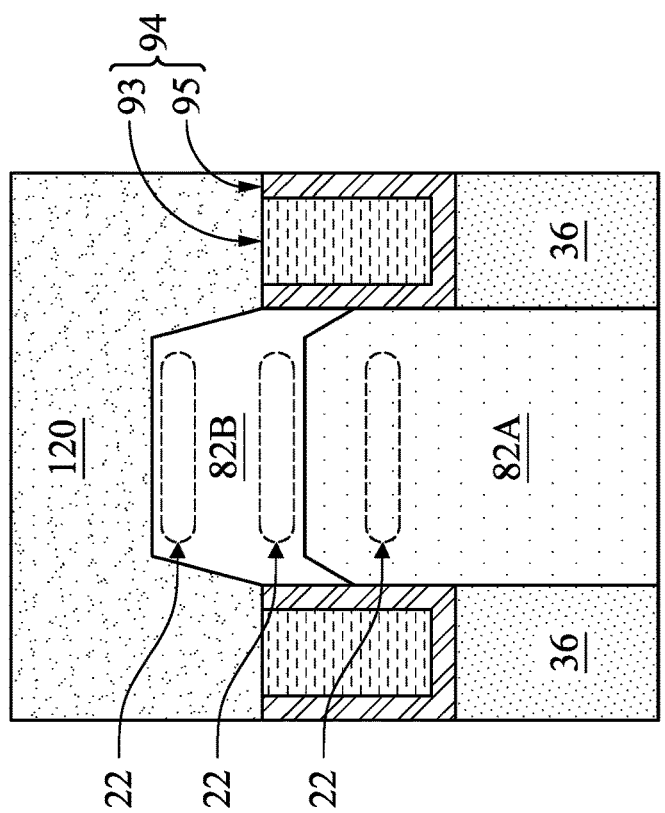
Figures 7A, 7B:
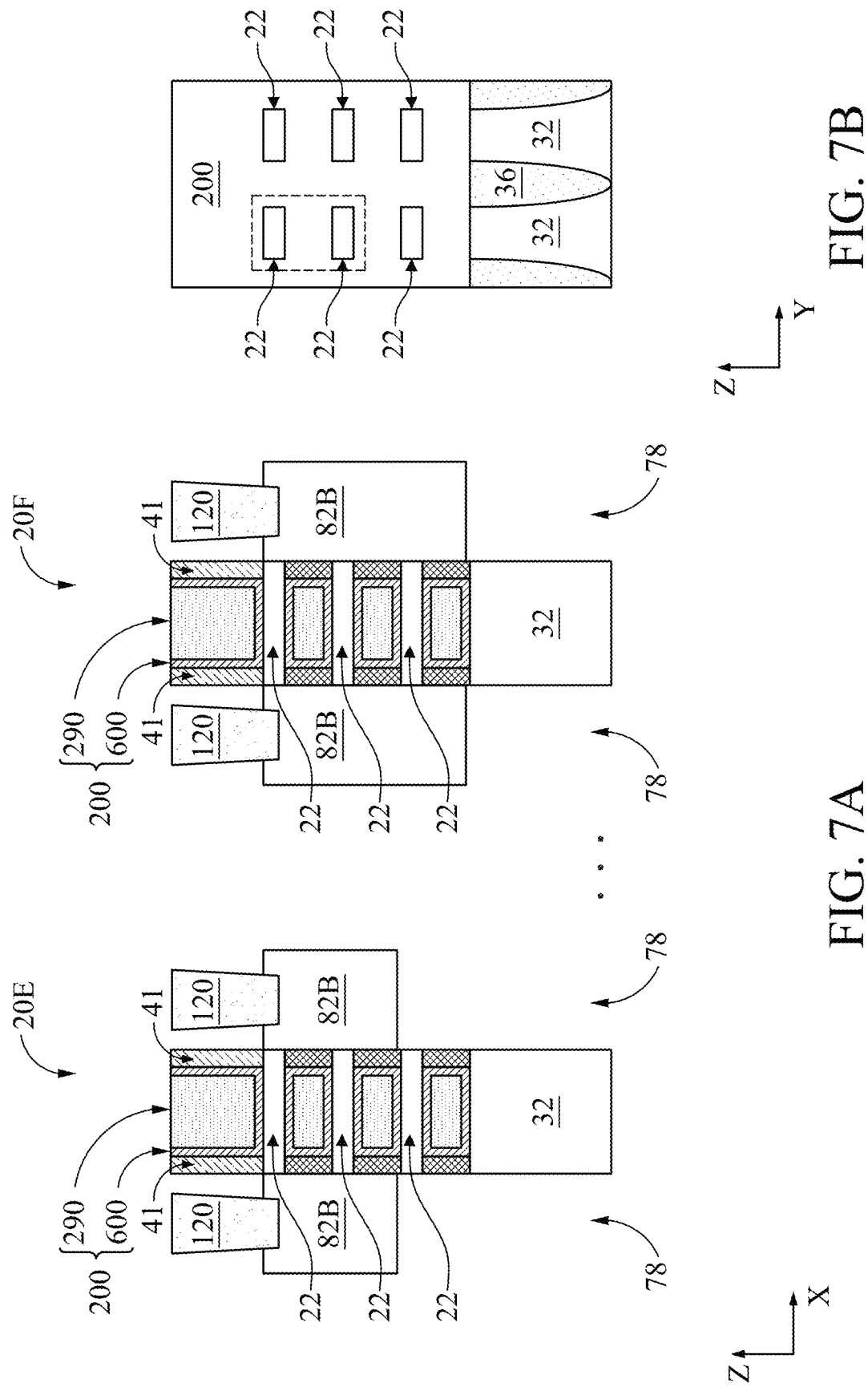
Figure 7D:
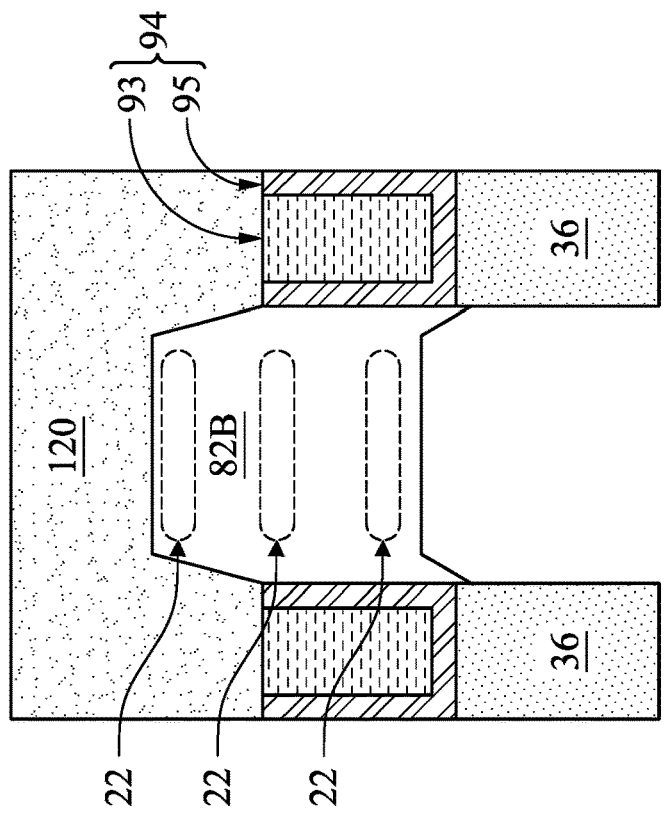
Figure 7C:
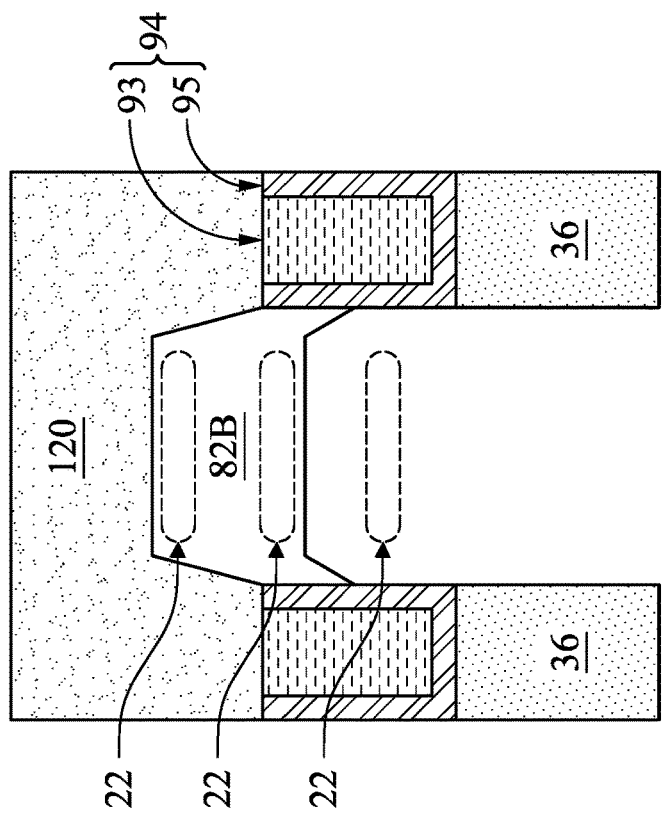

FIG. 1C shows a cross-sectional view of the nanostructure device 20B of FIG. 1A along the line C-C. In some embodiments, corner regions of the liner layer 810, the core layer 820, or both are tapered, as shown in FIG. 1C. The tapering may be a result of inheriting the shape of lower source/drain features 82A (see FIG. 4C). For example, an upper surface of the lower source/drain features 82A may have a convex (smooth or angular) profile. When the lower source/drain features 82A are replaced with the dielectric structures 800, the dielectric structures 800 may inherit the shape of the lower source/drain features 82A, including the convex profile thereof. A distance Dsioc between an uppermost extent of the liner layer 810 and an end of tapering of the corner regions may be in a range of about 0.5 nm to about 3 nm.

In FIG. 1D, in embodiments including the dielectric block 840 instead of the liner layer 810 and the core layer 820, the upper surface of the dielectric block 840 may have corner regions that are tapered. A distance $D_{840C}$ between an uppermost extent of the dielectric block 840 and an end of tapering of the corner regions may be in a range of about 0.5 nm to about 3 nm.

Referring to FIG. 1A, the channels 22A-22D each include a semiconductive material, for example silicon or a silicon compound, such as silicon germanium, or the like. The channels 22A-22D are nanostructures (e.g., having sizes that are in a range of a few nanometers) and may also each have an elongated shape and extend in the X-direction. In some embodiments, the channels 22A-22D each have a nano-wire (NW) shape, a nano-sheet (NS) shape, a nano-tube (NT) shape, or other suitable nanoscale shape. The cross-sectional profile of the channels 22A-22D may be rectangular, round, square, circular, elliptical, hexagonal, or combinations thereof.

In some embodiments, the lengths (e.g., measured in the X-direction) of the channels 22A-22D may be different from each other, for example due to tapering during a fin etching process. In some embodiments, length of the channel 22A may be less than a length of the channel 22B. The channels 22A-22D each may not have uniform thickness, for example due to a channel trimming process used to expand spacing (e.g., measured in the Z-direction) between the channels 22A-22D to increase gate structure fabrication process window. For example, a middle portion of each of the channels 22A-22D may be thinner than the two ends of each of the channels 22A-22D. Such shape may be collectively referred to as a "dog-bone" shape.

In some embodiments, the spacing between the channels 22A-22D is in a range of about 8 nanometers (nm) to about 12 nm. In some embodiments, a thickness (e.g., measured in the Z-direction) of each of the channels 22A-22D is in a range of about 5 nm to about 8 nm. In some embodiments, a width (e.g., measured in the Y-direction, not shown in FIG. 1A, orthogonal to the X-Z plane) of each of the channels 22A-22D is at least about 8 nm.

The gate structure 200 is disposed over, between and beneath the channels 22A-22D, respectively, which is shown in FIG. 1A. In some embodiments, the gate structure 200 is disposed over, between and beneath silicon channels for N-type devices or silicon germanium channels for P-type devices. In some embodiments, as illustrated in detail in FIG. 12, the gate structure 200 includes an interfacial layer (IL) 210, one or more gate dielectric layers 600, one or more work function tuning layers 900, and a metal core layer 290. Only the metal core layer 290 and the gate dielectric layer 600 are illustrated in FIG. 1A, for purposes of simplicity.

The interfacial layer 210, which may be an oxide of the material of the channels 22A-22D (e.g., silicon oxide), is formed on exposed areas of the channels 22A-22D and the top surface of the fin 32, when present. The interfacial layer 210 promotes adhesion of the gate dielectric layers 600 to the channels 22A-22D. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfSiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the nanostructure devices 20A-20C may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal core layer 290. The metal core layer 290 may include a conductive material such as tungsten, cobalt, ruthenium, iridium molybdenum, copper, aluminum, or combinations thereof. Between the channels 22A-22D, the metal core layer 290 is circumferentially surrounded (in the cross-sectional view) by the one or more work function metal layers 900, which are then circumferentially surrounded by the gate dielectric layers 600. The gate structure 200 may also include a glue layer that is formed between the one or more work function metal layers 900 and the metal core layer 290 to increase adhesion. The glue layer is not specifically illustrated in FIG. 1A for simplicity.

The nanostructure devices 20A-20D may also include gate spacers 41 and inner spacers 74 that are disposed on sidewalls of the gate dielectric layer 600 and the IL 210. The inner spacers 74 are also disposed between the channels 22A-22D. The gate spacers 41 and the inner spacers 74 may include a dielectric material, for example a low-k material such as SiOCN, SiON, SiN, or SiOC. In some embodiments, one or more additional spacer layers are present abutting the gate spacers 41.

The nanostructure devices 20A-20C may further include source/drain contacts 120 that are formed over the source/drain features 82B. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier layers (not shown), such as SiN or TiN, which help prevent or reduce diffusion of materials from and into the source/drain contacts 120. A silicide layer may also be formed between the source/drain features 82B and the source/drain contacts 120, so as to reduce the source/drain contact resistance. The silicide layer includes nickel, cobalt, titanium, tantalum, platinum, tungsten, other noble metals, other refractory metals, rare earth metals or their alloys. In some embodiments, thickness of the silicide layer (in the Z direction) is in a range of about 0.5 nm to about 5 nm. In some embodiments, height of the source/drain contacts 120 may be in a range of about 1 nm to about 50 nm.

In some embodiments, the source/drain features 82B are separated from others of the source/drain features 82B by hybrid fins 94 formed over isolation regions 36. In some embodiments, the isolation regions 36 are shallow trench isolation ("STI") regions. In some embodiments, each of the hybrid fins 94 includes a liner layer 95 and a fill layer 93. Hybrid fins 94 are separated from each other along the X-axis direction by the gate structures 200. The liner layer 95 may include a low-k dielectric layer comprising, SiN, SiCN, SiOCN, SiOC, or the like. The fill layer 93 may include a low-k dielectric material that is different from that (or those) of the liner layer 95. In some embodiments, the fill layer 93 includes SiN, silicon oxide, or another similar material. A top surface of the liner layer 95 may be above the top of the uppermost nanostructure 22A by about 0 nm (e.g., coplanar) to about 20 nm.

Certain of the nanostructure devices 20A-20D may further include an interlayer dielectric (ILD). The ILD provides electrical isolation between the various components of the nanostructure devices 20A-20D discussed above, for example between source/drain contacts 120. An etch stop layer may be formed prior to forming the ILD, and may be positioned laterally between the gate spacers 41 and the ILD or the source/drain contacts 120, and vertically between the ILD and the source/drain features 82B. In some embodiments, the etch stop layer is or includes SiN, SiCN, SiC, SiOC, SiOCN, $HfO_2$, $ZrO_2$, $ZrAlO_x$, $HfAlO_x$, $HfSiO_x$, $Al_2O_3$, or other suitable material. In some embodiments, thickness of the etch stop layer is in a range of about 1 nm to about 5 nm.

Figure 13:
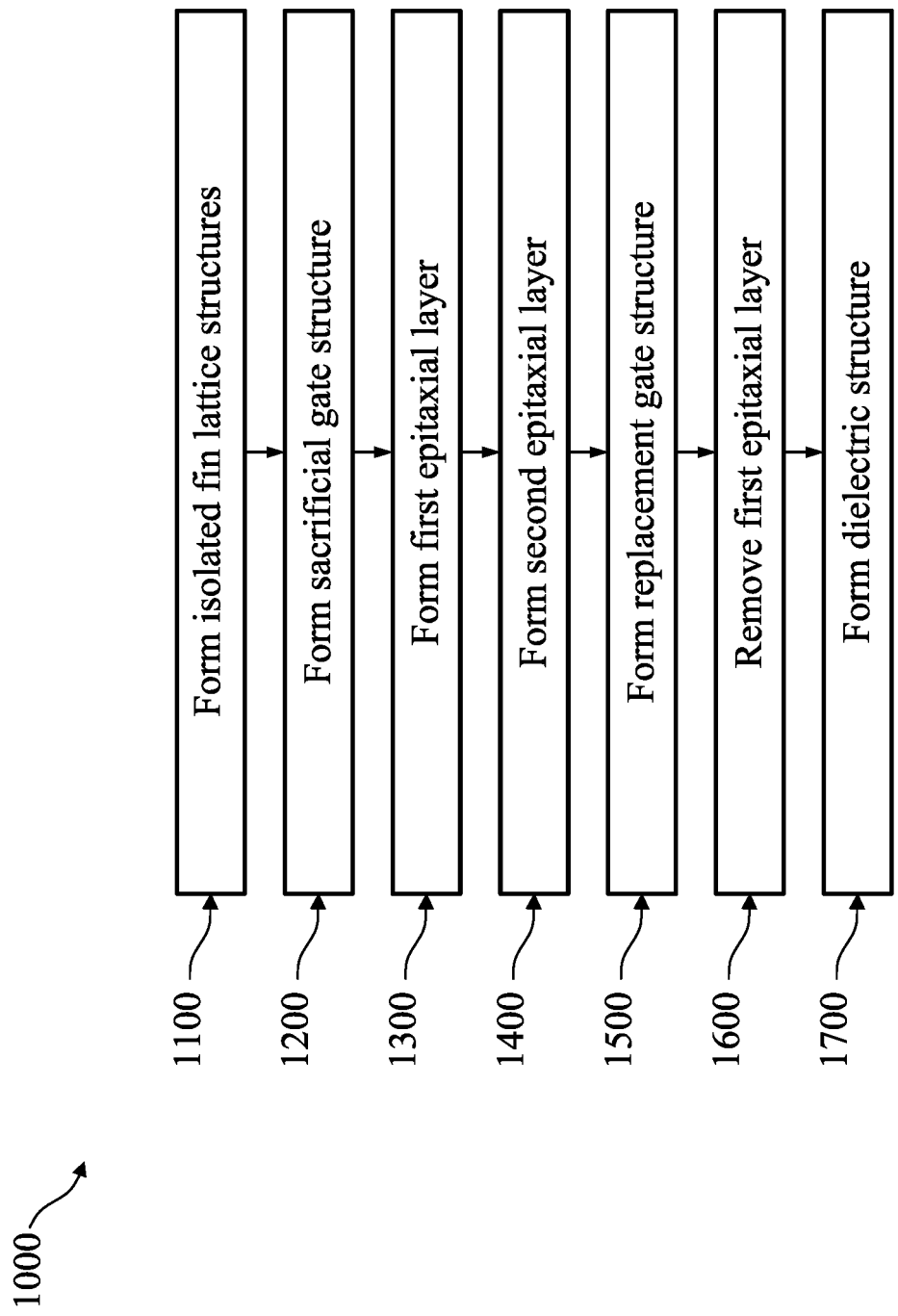
FIG. 13 is a flowchart illustrating a method of fabricating a semiconductor device according to various aspects of the present disclosure.

FIG. 13 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2A-2B, 3A, 3B and 4A-4D, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 10D are perspective views of intermediate stages in the manufacturing of nano-FETs, in accordance with some embodiments.

Figure 2A:
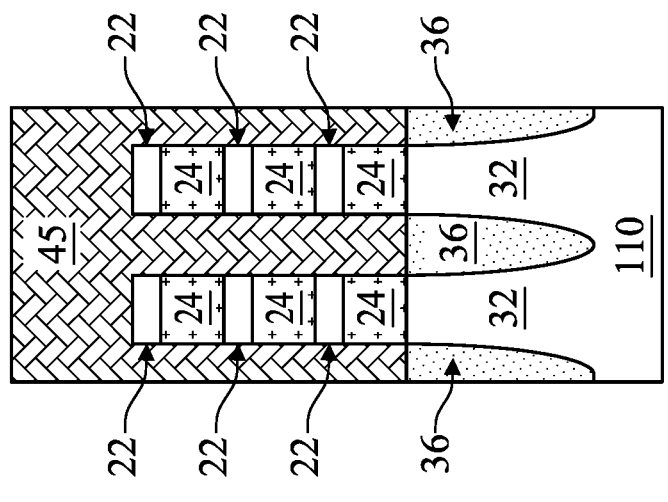
Figure 2B:
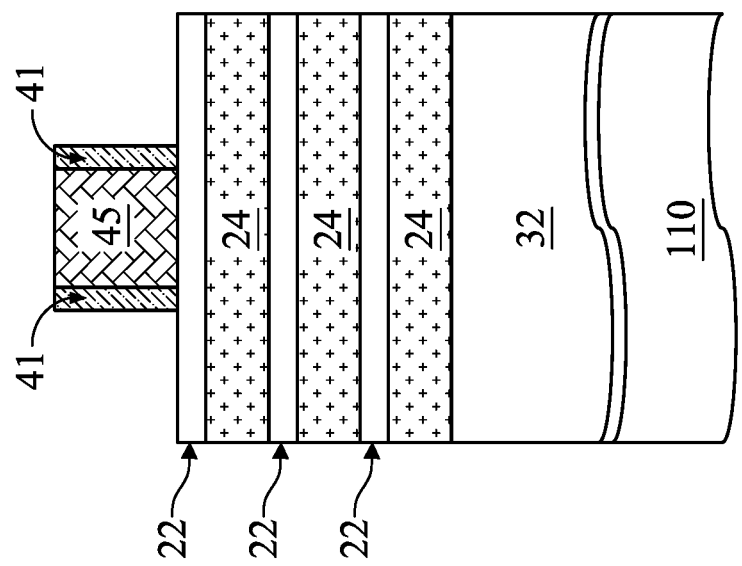

In FIGS. 2A and 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A, a multi-layer stack or "lattice" is formed over the substrate 110 of alternating layers of first semiconductor layers (e.g., precursors to the channels 22) and second semiconductor layers (e.g., precursors to buffer layers 24). In some embodiments, the first semiconductor layers may be formed of a first semiconductor material suitable for n-type nano-FETs, such as silicon, silicon carbide, or the like, and the second semiconductor layers may be formed of a second semiconductor material suitable for p-type nano-FETs, such as silicon germanium or the like. Each of the layers of the multi-layer stack may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers and the second semiconductor layers are illustrated. In some embodiments, the multi-layer stack may include one or two each or four or more each of the first semiconductor layers and the second semiconductor layers. Although the multi-layer stack is illustrated as including a second semiconductor layer as the bottommost layer, in some embodiments, the bottommost layer of the multi-layer stack may be a first semiconductor layer.

Due to high etch selectivity between the first semiconductor materials and the second semiconductor materials, the second semiconductor layers of the second semiconductor material may be removed without significantly removing the first semiconductor layers of the first semiconductor material, thereby allowing the first semiconductor layers to be patterned to form channel regions of nano-FETs. In some embodiments, the first semiconductor layers are removed and the second semiconductor layers are patterned to form channel regions. The high etch selectivity allows the first semiconductor layers of the first semiconductor material to be removed without significantly removing the second semiconductor layers of the second semiconductor material, thereby allowing the second semiconductor layers to be patterned to form channel regions of nano-FETs.

In FIG. 2A, fins 32 are formed in the substrate 110 and nanostructures 22, 24 are formed in the multi-layer stack corresponding to act 1100 of FIG. 13. In some embodiments, the nanostructures 22, 24 and the fins 32 may be formed by etching trenches in the multi-layer stack and the substrate 110. The etching may be any acceptable etch process, such as a reactive ion etch (ME), neutral beam etch (NBE), the like, or a combination thereof. The etching may be anisotropic. First nanostructures 22 (also referred to as "channels" below) are formed from the first semiconductor layers, and second nanostructures 24 are formed from the second semiconductor layers. Distance between adjacent fins 32 and nanostructures 22, 24 (e.g., in the Y-axis direction) may be from about 18 nm to about 100 nm. A portion of the IC device 10 is illustrated in FIG. 2A including a single fin 32 for simplicity of illustration. The method 1000 illustrated in FIGS. 2A-2B, 3A, 3B and 4A-4D may be extended to any number of fins, and is not limited to the one fin 32 shown.

While not shown in FIG. 2A, an oxide layer and hard mask layer may be formed over the top first semiconductor layer. In some embodiments, the oxide layer is a pad oxide layer, and the hard mask layer may include silicon. In some embodiments, the hard mask layer includes SiOCN, or another suitable silicon-based dielectric. In some embodiments, a second oxide layer (not shown) is formed over the hard mask layer. Formation of the second oxide layer may be similar to that of the oxide layer.

The fin 32 and the nanostructures 22, 24 may be patterned by any suitable method. For example, one or more photolithography processes, including double-patterning or multi-patterning processes, may be used to form the fin 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin 32.

The fin 32 may have straight, vertical sidewalls, such that a width of the fin 32 and/or the nanostructures 22, 24 (e.g., in the Y-axis direction) is substantially the same in a direction towards the substrate 110 (e.g., the Z-axis direction). In some embodiments, the fin 32 may have tapered sidewalls, such that each of the nanostructures 22, 24 may have a different width and be trapezoidal in shape.

Isolation regions 36, which may be shallow trench isolation (STI) regions, are formed adjacent the fin 32, e.g., in the Y-axis direction. The isolation regions 36 may be formed by depositing an insulation material over the substrate 110, the fin 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner. The insulation material may be deposited as a conformal layer having thickness in a range of about 10 nm to about 40 nm. In regions in which neighboring fins 32 are close together (e.g., less than about 10 nm separation), the insulation material may merge in the space between the neighboring fins 32. In regions in which the neighboring fins 32 are separated by a large distance (e.g., greater than about 10 nm, such as greater than about 50 nm), the insulation material may not merge, and may be deposited on sidewalls of the fins 32 and an upper surface of the substrate 110 with a gap therebetween.

The insulation material of the isolation regions 36 may then undergo a removal process, such as an etch-back process with top surfaces of the nanostructures 22 protected by the hard mask layer. The insulation material is recessed to form the isolation regions 36. After recessing, the nanostructures 22, 24 and upper portions of the fins 32 may protrude from between neighboring isolation regions 36. The isolation regions 36 may have top surfaces that are flat, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered. Following etch back of the isolation regions 36, the top surface of the isolation regions 36 may be coplanar with or substantially coplanar with the top surface of the fins 32 or the bottom surface of the nanostructures 24 most proximal the substrate 110. In some embodiments, the top surface of the isolation regions 36 is lower than (e.g., closer to the substrate 110) the bottom surface of the nanostructures 24 most proximal the substrate 110 by a distance in a range of about 3 nm to about 10 nm. Recessing the isolation regions 36 to a level slightly below the top surface of the fins 32 may be beneficial in subsequent operations, such as formation of second hybrid fins and formation of source/drain features 82A, 82B.

In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Following recessing of the isolation regions 36, dummy gate structures (or "sacrificial gate structures") are formed over the fins 32 and/or the nanostructures 22, 24, corresponding to act 1200 of FIG. 13. A sacrificial gate layer 45 is formed over the fins 32 and/or the nanostructures 22, 24. The sacrificial gate layer 45 may be made of materials that have a high etching selectivity versus the isolation regions 36. The sacrificial gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The sacrificial gate layer 45 may be deposited by physical vapor deposition (PVD), chemical vapor deposition (CVD), sputter deposition, or other techniques for depositing the selected material. A mask layer, which may include a first mask layer and a second mask layer, may be formed over the sacrificial gate layer 45, and may include, for example, silicon nitride, silicon oxynitride, or the like. In some embodiments, a gate dielectric layer is formed before the sacrificial gate layer 45 between the sacrificial gate layer 45 and the fins 32 and/or the nanostructures 22, 24.

A spacer layer 41 is formed over sidewalls of the mask layers and the sacrificial gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer over the mask layers and the sacrificial gate layer 45. Following deposition of the spacer layer 41, a second spacer layer may be deposited over the spacer layer 41. In some embodiments, the second spacer layer is formed by depositing polysilicon as a conformal layer over the spacer layer 41. Each of the spacer layer 41 and the second spacer layer may be deposited as a single layer or multiple layers (e.g., two layers). In some embodiments, the second spacer layer is omitted.

In some embodiments, the spacer layer 41 is formed alternately or additionally after removal of the sacrificial gate layer 45. In such embodiments, the sacrificial gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as the gate structure 200.

Figure 3B:
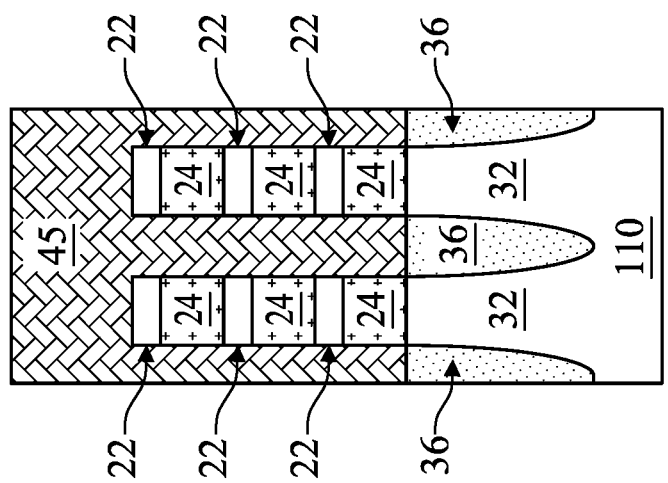
Figure 3A:
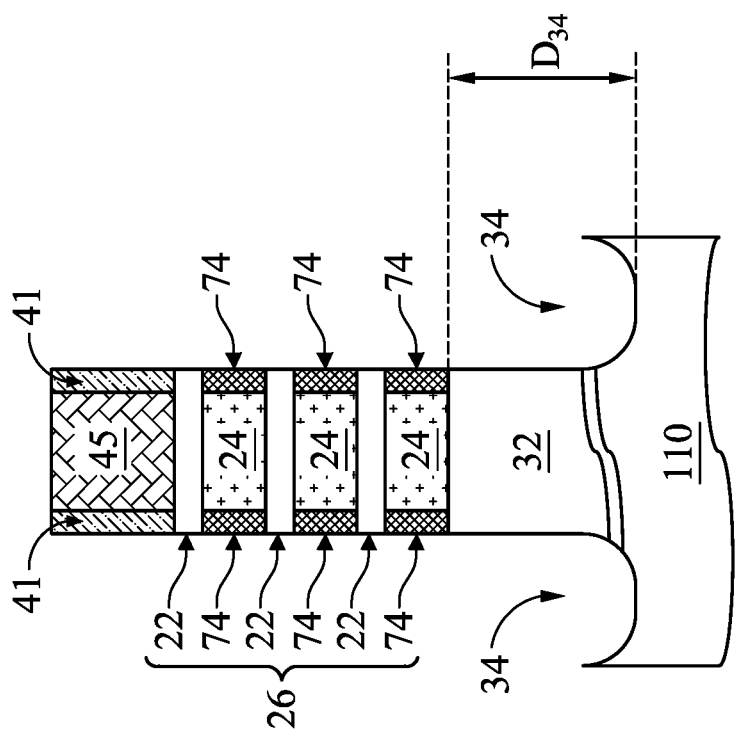

In FIGS. 3A and 3B, an etching process is performed to etch the portions of protruding fins 32 and/or nanostructures 22, 24 that are not covered by dummy gate structures, resulting in the structure shown. The recessing may be anisotropic, such that the portions of fins 32 directly underlying dummy gate structures and the spacer layer 41 are protected, and are not etched. The top surfaces of the recessed fins 32 may be substantially coplanar with the top surfaces of the isolation regions 36, in accordance with some embodiments. The top surfaces of the recessed fins 32 may be lower than the top surfaces of the isolation regions 36. As shown in FIGS. 3A and 3B, openings 34 formed by the etching process that recesses the fins 32 extend to a level below the upper surface of the fins 32 and the lower surface of the lowest nanostructure 24 shown by distance D34. In some embodiments, the distance D34 is in a range of about 40 nm to about 100 nm.

Following recessing of the protruding fins 32 and nanostructures 22, 24, inner spacers 74 are formed, which is also illustrated in FIG. 3A. A selective etching process is performed to recess end portions of the nanostructures 24 exposed by openings in the spacer layer 41 without substantially attacking the nanostructures 22. After the selective etching process, recesses are formed in the nanostructures 24 at locations where the removed end portions used to be.

Next, an inner spacer layer is formed to fill the recesses in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 3A.

FIGS. 4A-4D illustrate formation of source/drain features 82A, 82B corresponding to acts 1300 and 1400 of FIG. 13. In the illustrated embodiment, the source/drain features 82A, 82B are epitaxially grown from epitaxial material(s). In some embodiments, the source/drain features 82A, 82B exert stress in the respective channels 22, thereby improving performance. The source/drain features 82A, 82B are formed such that each dummy gate structure is disposed between respective neighboring pairs of the source/drain features 82A, 82B. In some embodiments, the spacer layer 41 separates the source/drain features 82B from the sacrificial gate layer 45 by an appropriate lateral distance to prevent electrical bridging to subsequently formed gates (e.g., the gate structures 200) of the resulting device.

The source/drain features 82A, 82B include lower source/drain features 82A and the upper source/drain features 82B. The lower source/drain features 82A are formed in a first formation operation corresponding to act 1300 of FIG. 13. In some embodiments, the lower source/drain features 82A include any acceptable epitaxially grown semiconductor material. In some embodiments, the lower source/drain features 82A include any acceptable epitaxially grown semiconductor material, such as silicon, SiC, SiCP, SiP, SiGe, SiGeB, Ge, GeSn, combinations thereof or the like. Generally, the material of the lower source/drain features 82A has etch selectivity to the material of the fin 32, and is different than the material of the fin 32. As such, when the fin 32 is silicon, the lower source/drain feature 82A may be SiGe or another suitable material different than silicon. In some embodiments, the lower source/drain feature 82A is SiGe that is substantially or completely free of dopants.

The lower source/drain features 82A are replaced in a subsequent operation (see FIGS. 8A-8D) with the dielectric structures 800 to disable a number of the channels 22. For example, as shown in FIG. 4A, a nanostructure device 20E has lower source/drain features 82A that extend to a height above the lowest channel 22, and a nanostructure device 20F has lower source/drain features 82A that extend to a height substantially the same as, or slightly higher than, the top of the fin 32 and lower than the lowest channel 22. To form lower source/drain features 82A of different heights on the same wafer or the same integrated circuit die, the lower source/drain features 82A of the nanostructure devices 20E, 20F may be formed in different operations. For example, the nanostructure device 20E may be masked while the lower source/drain features 82A of the nanostructure device 20F are epitaxially grown, and the nanostructure device 20F may be masked while the lower source/drain features 82A of the nanostructure device 20E are epitaxially grown. For the IC device 10 of FIG. 1A, three masks may be used to form the lower source/drain features 82A of the nanostructure devices 20A-20C at three different heights. Number of masks used to form the lower source/drain features 82A may generally be about the same as the number of nanostructure layers 22 included in the wafer.

Following formation of the lower source/drain features 82A, the upper source/drain features 82B are formed on the lower source/drain features 82A corresponding to act 1400 of FIG. 13. Forming the upper source/drain features 82B on the lower source/drain features 82A, which are a semiconductor such as SiGe, improves epitaxial growth of the upper source/drain features 82B. For example, few or no voids are formed between the lower and upper source/drain features 82A, 82B, such that stress loss due to dislocation is reduced or eliminated. Formation of the upper source/drain features 82B may be performed in a second formation operation different from the first formation operation. For example, the second formation operation may include different precursor gases than the first formation operation.

The upper source/drain features 82B generally include a different material than the lower source/drain features 82A. For n-type devices, the upper source/drain features 82B may include materials exerting a tensile strain in the channel regions, such as silicon, SiC, SiCP, SiP, or the like, in some embodiments. In some embodiments, the upper source/drain features 82B of the n-type devices include silicon doped with n-type dopants. When p-type devices are formed, the upper source/drain features 82B include materials exerting a compressive strain in the channel regions, such as SiGe, SiGeB, Ge, GeSn, or the like, in accordance with certain embodiments. In some embodiments, the upper source/drain features 82B of the p-type devices include SiGe doped with p-type dopants.

The upper source/drain features 82B may have surfaces raised from respective surfaces of the fins and may have facets. Neighboring upper source/drain features 82B may merge in some embodiments to form a singular upper source/drain feature 82B adjacent two neighboring fins 32. Generally, merging of neighboring upper source/drain features 82B is prevented by inclusion of the hybrid fins 94. When merging is desired, a hybrid fin 94 may be omitted between the neighboring upper source/drain features 82B, such that growth of the neighboring upper source/drain features 82B is not blocked (e.g., constrained) by the presence of the hybrid fin 94 adjacent thereto. The upper source/drain features 82B may have lateral sidewalls in the Y-axis direction that contact the hybrid fins 94.

The upper source/drain features 82B may be implanted with dopants followed by an anneal. The upper source/drain features 82B may have an impurity concentration of between about $10^{19}$ cm$^{-3}$ and about $10^{21}$ cm$^{-3}$. N-type and/or p-type impurities for upper source/drain features 82B may be any of the impurities previously discussed. In some embodiments, the upper source/drain features 82B are in situ doped during growth.

Figure 11A:
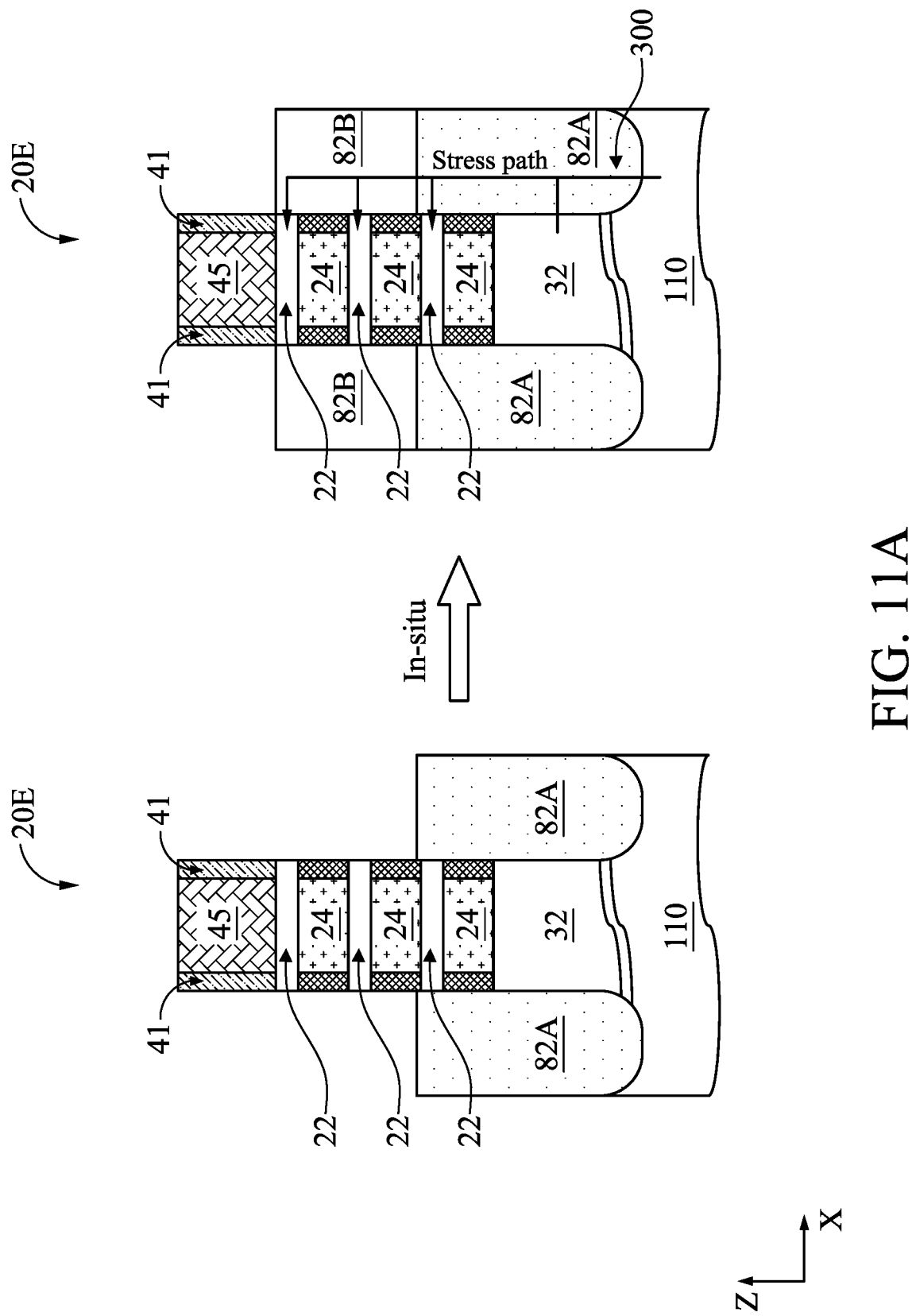
FIGS. 11A and 11B are views illustrating of an IC device at various stages of fabrication in accordance with various embodiments.
Figure 11B:
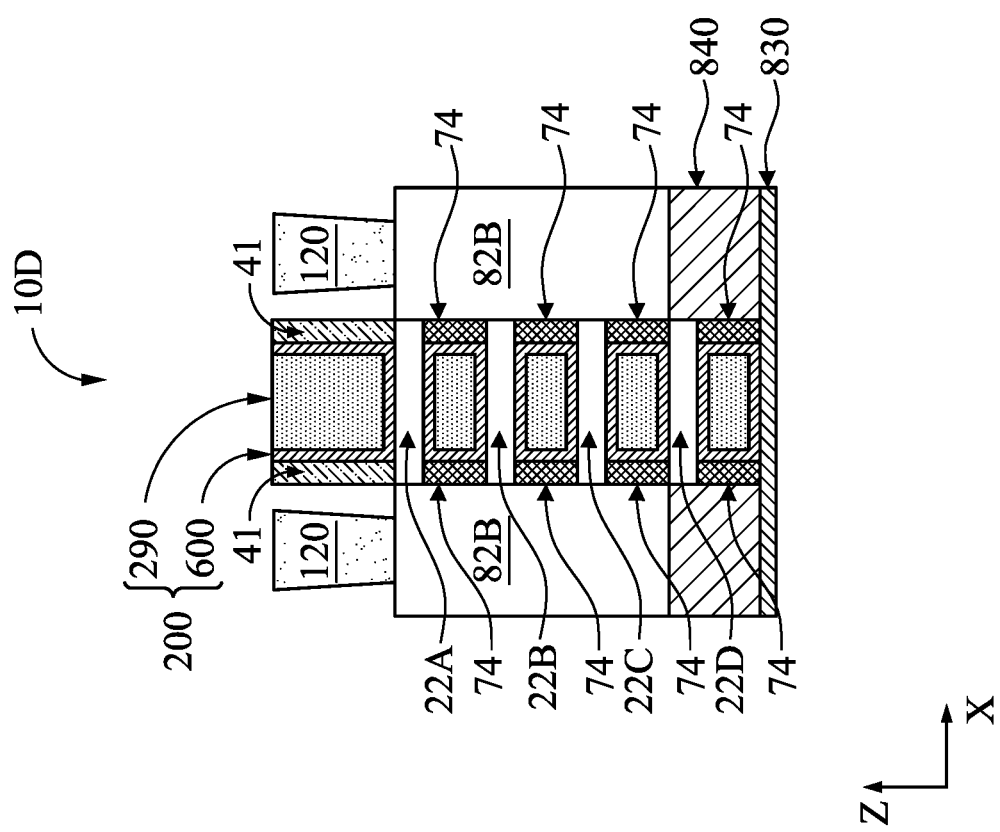

FIG. 11A illustrates an embodiment in which the lower and upper source/drain features 82A, 82B are formed in-situ. In some embodiments, the lower source/drain features 82A are formed (e.g., grown epitaxially) in a chamber. Following formation of the lower source/drain features 82A, without removing the IC device 10 from the chamber, the upper source/drain features 82B are formed (e.g., grown epitaxially) in the chamber. In some embodiments, following formation of the lower and upper source/drain features 82A, 82B of the nanostructure device 20E, a mask that protects other nanostructure devices (e.g., the nanostructure device 20F) may be removed, and a second mask may be formed that protects the nanostructure device 20E. The above operations for forming the lower and upper source/drain features 82A, 82B may then be repeated with the nanostructure device 20F exposed and the nanostructure device 20E protected.

FIG. 11A also illustrates a stress path 300. By forming the lower and upper source/drain features 82A, 82B as described instead of using a dielectric blocking layer between the lower and upper source/drain features 82A, 82B, the stress path 300 is unbroken and can affect all of the channels 22. As such, because of the lower source/drain features 82A, PFET channels 22 are stressed from the substrate 110 through the lower source/drain features 82A and the upper source/drain features 82B. In a subsequent replacement gate operation in which the sacrificial gate layer 45 is replaced by the gate structure 200, the stress effect is locked by the gate structure 200, then the lower source/drain features 82A can be removed without substantially loss of stress. The stress path 300 may be present when the lower and upper source/drain features 82A, 82B are formed in-situ, as shown in FIG. 11A, and may also be present when the lower and upper source/drain features 82A, 82B are formed ex-situ (e.g., the IC device 10 is removed from the chamber between formation of the lower source/drain features 82A and the upper source/drain features 82B).

In FIGS. 5A-5D, the gate structure 200 is formed following removal of the sacrificial gate layer 45 corresponding to act 1500 of FIG. 13, and source/drain contacts 120 are formed to establish electrical connection to the upper source/drain features 82B.

In some embodiments, a contact etch stop layer (CESL) is formed as a conformal layer overlying the gate spacer 41, the hybrid fins and the upper source/drain features 82B. The CESL may be a dielectric material layer, and may include silicon nitride or another suitable material. In some embodiments, the CESL is or includes SiN, SiCN, SiC, SiOC, SiOCN, HfO2, ZrO2, ZrAlOx, HfAlOx, HfSiOx, Al2O3, a combination thereof, or other suitable material. In some embodiments, thickness of the CESL is in a range of about 1 nm to about 5 nm.

In some embodiments, an interlayer dielectric (ILD) is then formed. Initially, the ILD may cover the sacrificial gate layer 45, the hybrid fins, and the upper source/drain features 82B. Excess material of the ILD may then be removed. The ILD may include an appropriate dielectric material, such as SiO, SiN, SiC, SiOCN, SiOC, SiCN, AlO, AlON, ZrSi, ZrO, ZrN, ZrAlO, LaO, HfO, HfSi, YO, TiO, TaO, TaCN, ZnO, combinations thereof, or other suitable dielectric materials.

The channels 22 are released by removal of the nanostructures 24, the mask layer when present, and the sacrificial gate layer 45. A planarization process, such as a CIVIP, may be performed to level top surfaces of the sacrificial gate layer 45, ILD, CESL, and gate spacer layer 41. The planarization process may also remove the mask layers when present from over the sacrificial gate layer 45. Accordingly, the top surface of the sacrificial gate layer 45 is exposed.

Next, the sacrificial gate layer 45 is removed in an etching process, so that recesses are formed. In some embodiments, the sacrificial gate layer 45 is removed by an anisotropic dry etch process. For example, the etching process may include a dry etch process using reaction gas(es) that selectively etch the sacrificial gate layer 45 without etching the spacer layer 41, the CESL and the ILD. The dummy gate dielectric, when present, may be used as an etch stop layer when the sacrificial gate layer 45 is etched. Following partial removal of the sacrificial gate layer 45 up to the gate dielectric layer, the gate dielectric layer is exposed.

Exposed upper portions of the gate dielectric layer are removed by a suitable etching operation. In the same etching operation used to remove the exposed upper portions of the gate dielectric layer, or in a different (e.g., subsequent) etching operation, the gate spacer layer 41 and the hybrid fins may be trimmed. Trimming of the gate spacer layer 41 may be performed by an isotropic etch operation.

Following trimming of the gate spacer layer 41, and with remaining portions of the sacrificial gate layers 45 exposed, another etching operation is performed that removes the remaining portions of the sacrificial gate layers 45. At this intermediate stage, the sacrificial gate layers 45 may be completely removed.

The nanostructures 24 are then removed to release the nanostructures 22. After the nanostructures 24 are removed, the nanostructures 22 form a plurality of nanosheets that extend horizontally (e.g., parallel to a major upper surface of the substrate 110; e.g., in the X-Y plane). The nanosheets may be collectively referred to as the channels 22 of the nanostructure devices formed.

In some embodiments, the dummy gate dielectric is removed completely, so as to expose the nanostructures 22, 24. The nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N$_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanostructures 22 are reshaped (e.g. thinned) by a further etching process to improve gate fill window. The reshaping may be performed by an isotropic etching process selective to the nanostructures 22. After reshaping, the nanostructures 22 may exhibit the dog bone shape in which middle portions of the nanostructures 22 are thinner than peripheral portions of the nanostructures 22 along the X-axis direction.

Figure 12:
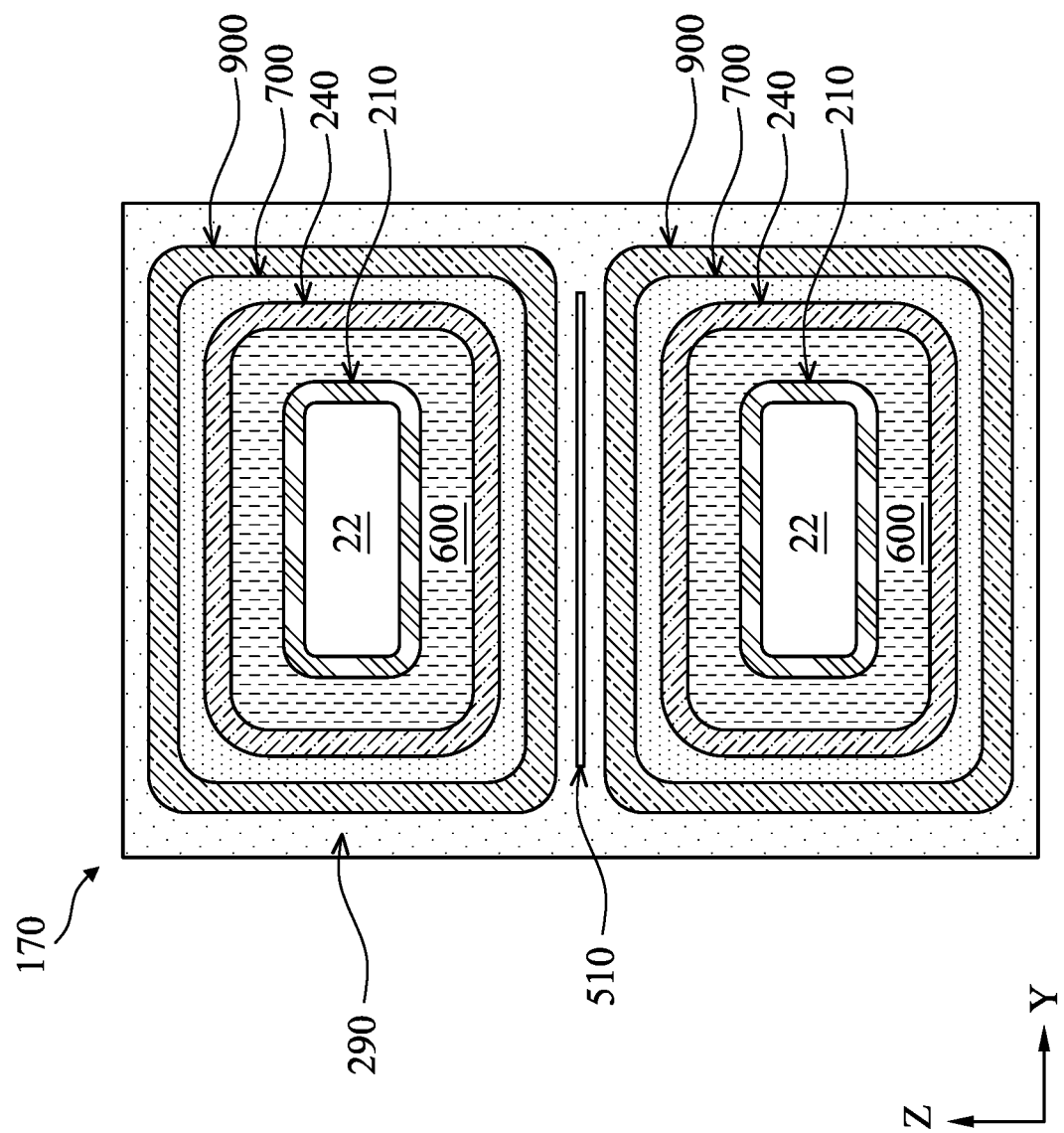
FIG. 12 is a cross-sectional side view of a portion of a gate structure in accordance with various embodiments.

Following removal of the nanostructures 24, replacement gates 200 are formed. FIG. 12 is a detailed view of the replacement gate 200 along the Y-Z plane. The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 12, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 12, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses $HfCl_4$ and/or $H_2O$ as precursors. Such an ALD process may form the gate dielectric layer 600 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide ($k \approx 3.9$). Exemplary high-k dielectric materials include HfO2, HfSiO, HfSiON, HfTaO, HfTiO, HfZrO, ZrO2, Ta2O5, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A-20E.

With further reference to FIG. 12, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the second work function layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 12, after forming the second IL 240 and removing the high-k capping layer, the second work function layer 700 is optionally formed on the gate structure 200, in accordance with some embodiments. The second work function layer 700 is or comprises a metal nitride, such as TiN, WN, MoN, TaN, or the like. In a specific embodiment, the second work function layer 700 is TiN. The second work function layer 700 may have thickness ranging from about 5 A to about 20 A. Inclusion of the second work function layer 700 provides additional threshold voltage tuning flexibility. In general, the second work function layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the second work function layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 12 further illustrates the metal core layer 290. In some embodiments, a glue layer (not separately illustrated) is formed between the oxygen blocking layer of the work function metal layer and the metal core layer 290. The glue layer may promote and/or enhance the adhesion between the metal core layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal core layer 290 may be formed on the glue layer, and may include a conductive material such as tungsten, cobalt, ruthenium, iridium, molybdenum, copper, aluminum, or combinations thereof. In some embodiments, the metal core layer 290 may be deposited using methods such as CVD, PVD, plating, and/or other suitable processes. In some embodiments, a seam 510, which may be an air gap, is formed in the metal core layer 290 vertically between the channels 22A-22D. In some embodiments, the metal core layer 290 is conformally deposited on the work function metal layer 900. The seam 510 may form due to sidewall deposited film merging during the conformal deposition. In some embodiments, the seam 510 is not present between the neighboring channels 22A-22D.

Further to FIGS. 5A-5D, following formation of the gate structures 200, a capping layer, which may be referred to as a self-aligned capping (SAC) layer, may be formed. The SAC layer may be formed of a dielectric material by a suitable deposition process. The dielectric material of the SAC layer may include SiO, SiN, SiC, SiOCN, SiOC, SiCN, AlO, AlON, ZrSi, ZrO, ZrN, ZrAlO, LaO, HfO, HfSi, YO, TiO, TaO, TaCN, ZnO, a combination thereof, or the like. The SAC layer may be formed by CVD, ALD, or another suitable process. The SAC layer protects the underlying gate structure 200 during formation of the source/drain contacts 120 in subsequent operations.

The source/drain contacts 120 may be formed following formation of the SAC layer. In some embodiments, one or more masks are formed over the ILD, the CESL and the SAC layer, and exposed portions of the ILD are etched through the masks to form openings in the ILD. The source/drain contacts 120 are then formed in the openings by a suitable deposition operation, such as a PVD, a CVD, an ALD or other appropriate deposition operation. In some embodiments, portions of the CESL exposed by the openings are trimmed prior to forming the source/drain contacts 120 to increase space for depositing the material of the source/drain contacts 120.

The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. In some embodiments, one or more barrier layers (not shown), such as SiN or TiN, are deposited prior to depositing the source/drain contacts 120, which may prevent or reduce diffusion of materials from and into the source/drain contacts 120. A silicide layer may also be formed between the source/drain features 82B and the source/drain contacts 120, so as to reduce the source/drain contact resistance. The silicide layer may include nickel, cobalt, titanium, tantalum, platinum, tungsten, other noble metals, other refractory metals, rare earth metals or their alloys. In some embodiments, thickness of the silicide layer (in the Z-axis direction) is in a range of about 0.5 nm to about 5 nm. In some embodiments, height of the source/drain contacts 120 may be in a range of about 1 nm to about 50 nm.

In FIGS. 6A-6D, following formation of the gate structure 200 and the source/drain contacts 120 in FIGS. 5A-5D, the lower source/drain features 82A are exposed by thinning or removing the substrate 110. The thinning or removing may be or include grinding, CMP, etching, combinations thereof or the like. In some embodiments, the substrate 110 is thinned from the backside by CMP.

In FIGS. 7A-7D, following exposing the lower source/drain features 82A, openings 78 are formed by removing the lower source/drain features 82A, corresponding to act 1600 of FIG. 13. In some embodiments, the lower source/drain features 82A are removed by one or more etching operations. For example, an isotropic etch operation may be performed that removes the material of the lower source/drain features 82A without substantially attacking the fin 32, the inner spacers 74, the channels 22, and the upper source/drain features 82B. Removal of the lower source/drain features 82A exposes the lowermost channel 22 of the nanostructure device 20E. As such, the lowermost channel 22 of the nanostructure device 20E is no longer physically connected to the upper source/drain features 82B.

In some embodiments, dopants of the upper source/drain features 82B may migrate into the lower source/drain features 82A prior to the etching operation that removes the lower source/drain features 82A. As such, dopant concentration may be a gradient from the high dopant concentration of the upper source/drain features 82B to the low dopant concentration of the lower source/drain features 82A. As etch selectivity between the lower and upper source/drain features 82A, 82B is dependent on relative dopant concentration in the lower and upper source/drain features 82A, 82B, following the etch operation that removes the lower source/drain features 82A, a region of the upper source/drain features 82B having the dopant concentration gradient may be present at the end of the upper source/drain features 82B distal the source/drain contacts 120 (e.g., the end that was proximal the substrate 110 prior to removal of the substrate 110).

Figures 8A, 8B:
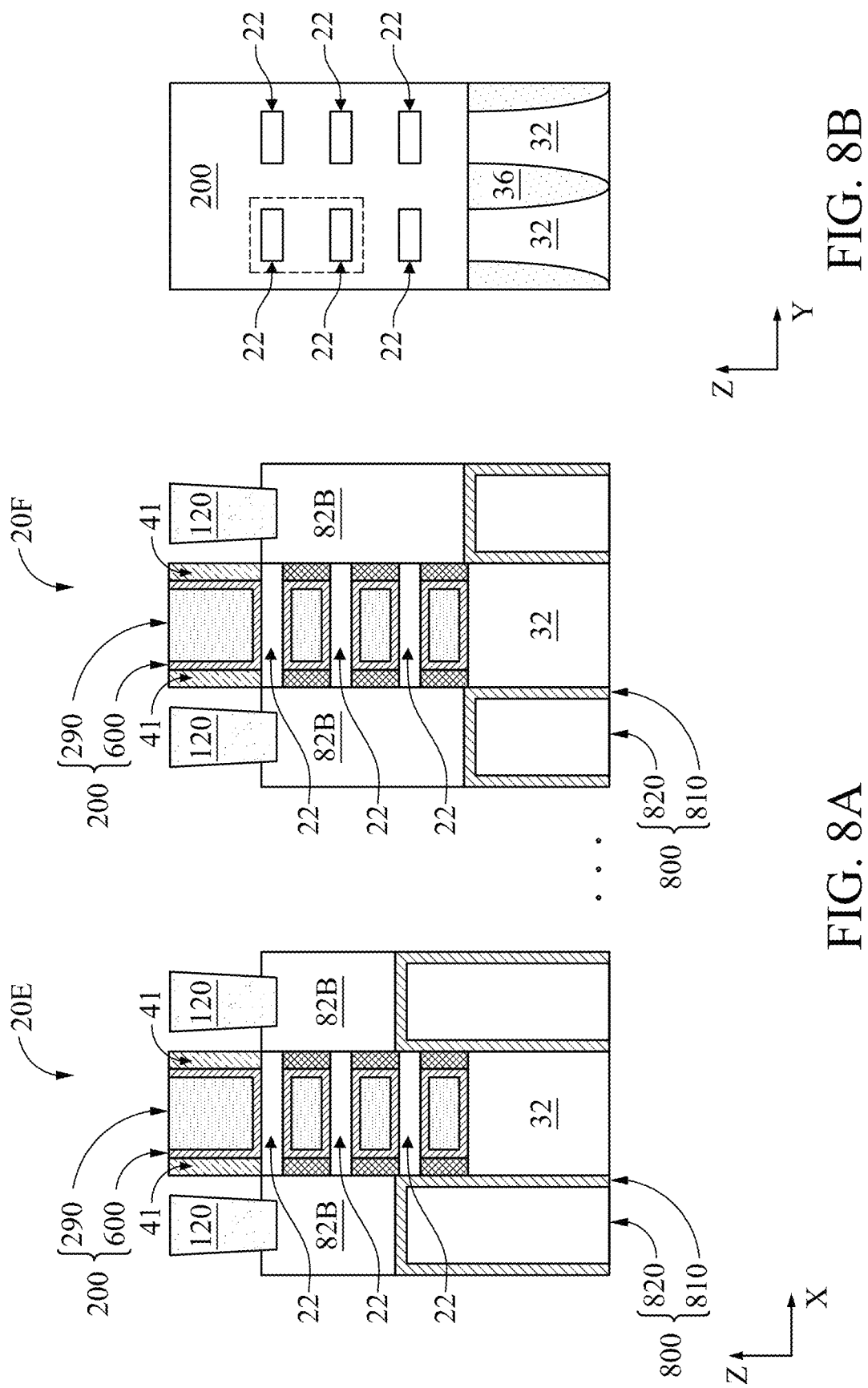
Figure 8D:
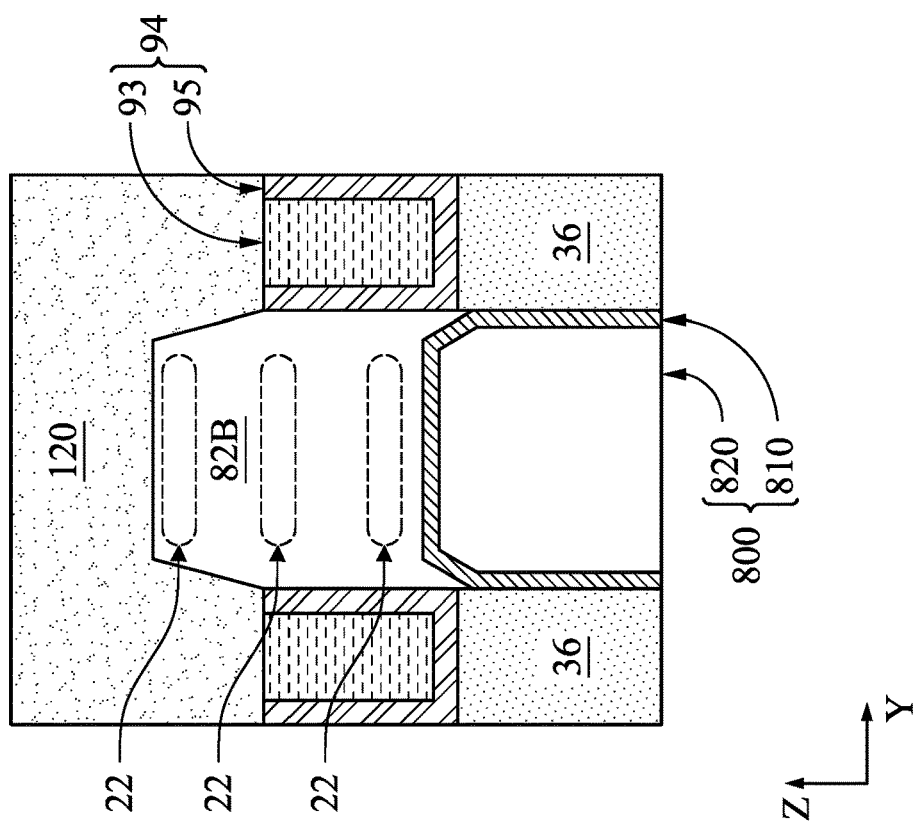
Figure 8C:
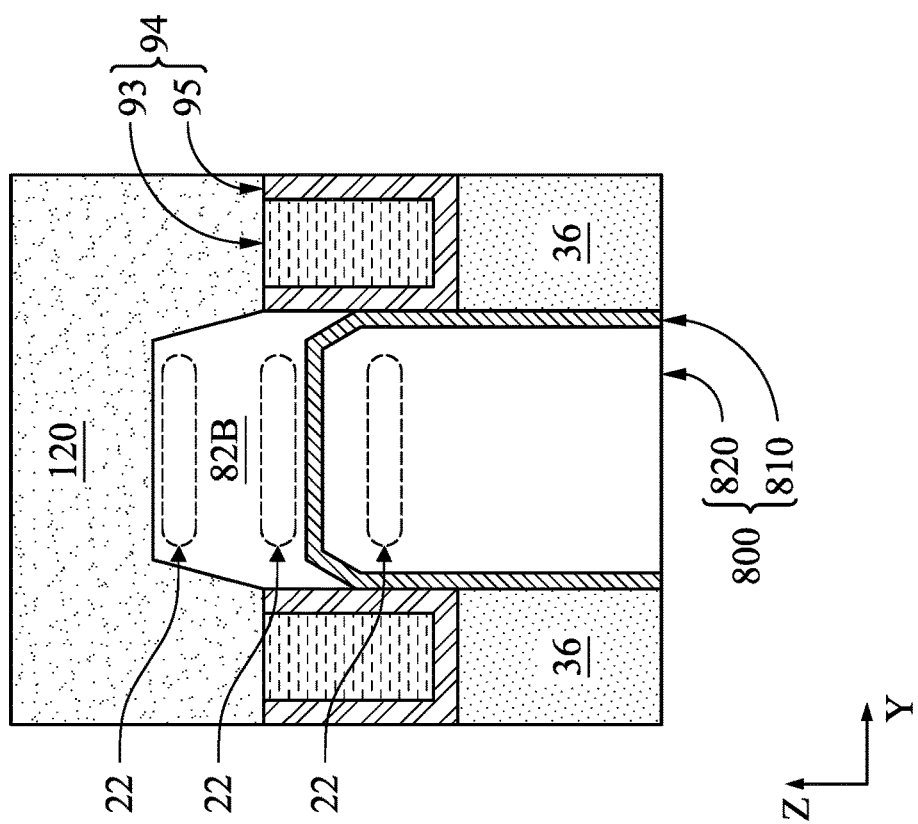
Figures 9A, 9B:
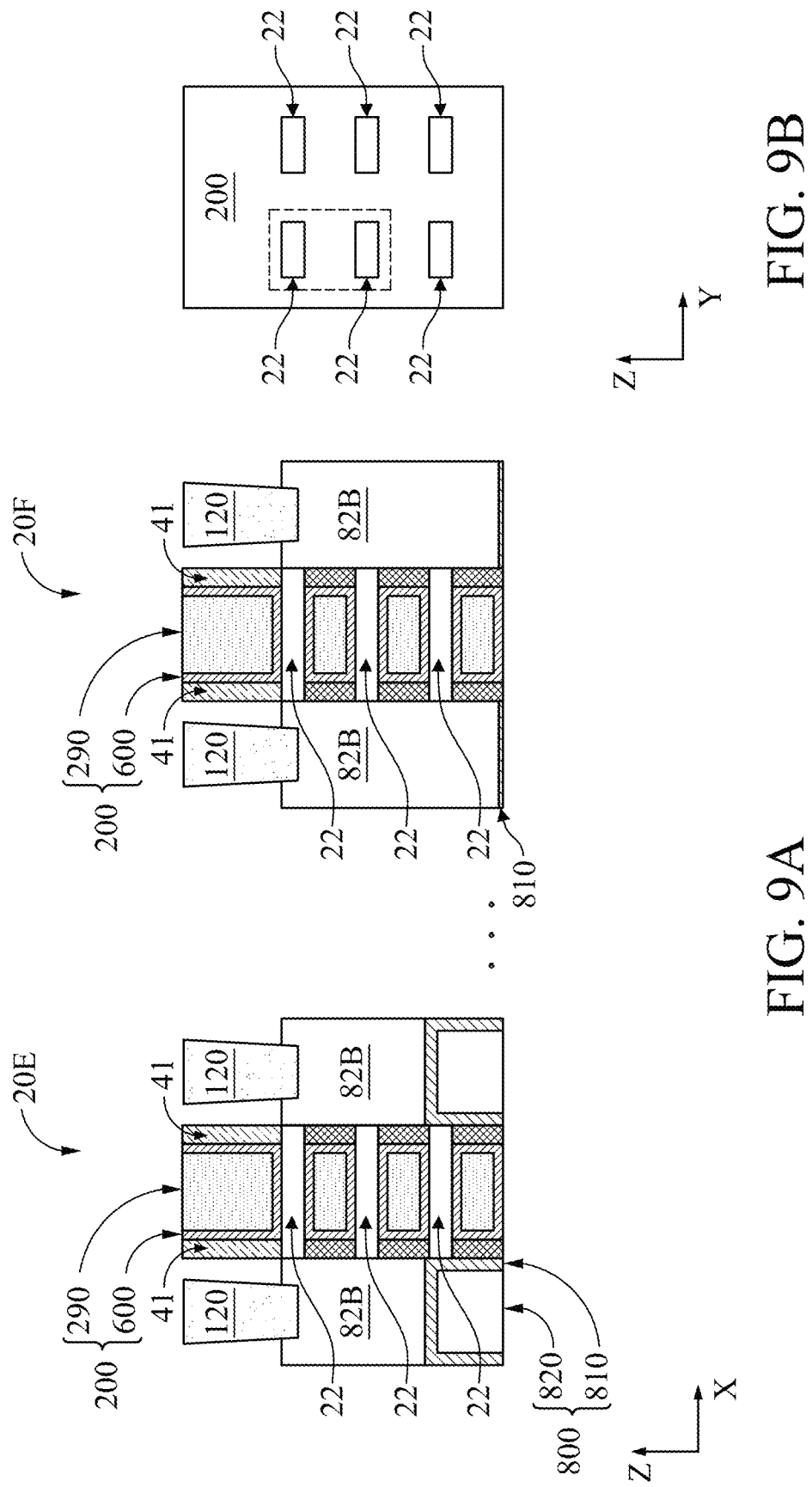
Figure 9D:
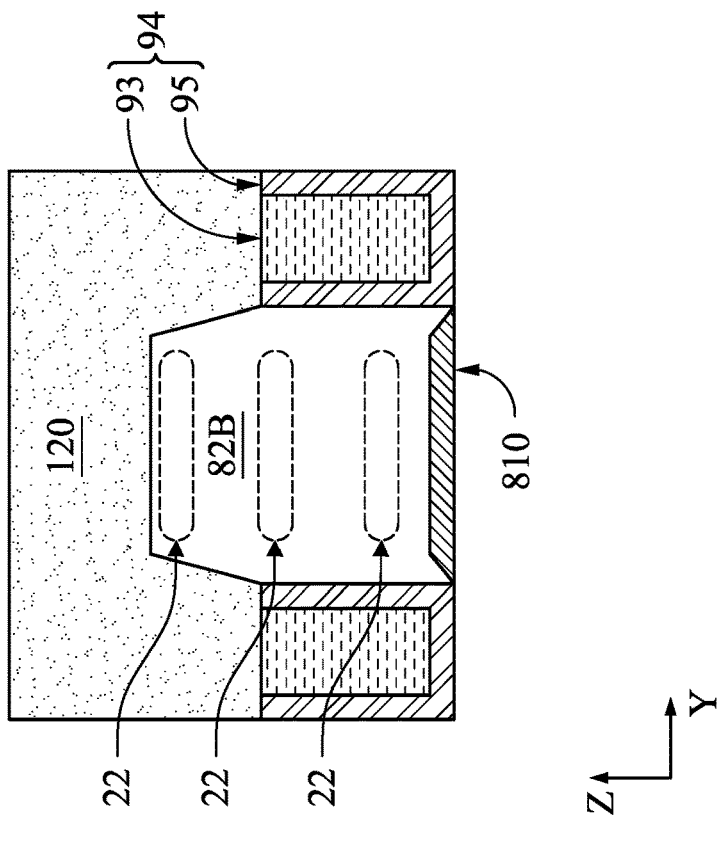
Figure 9C:
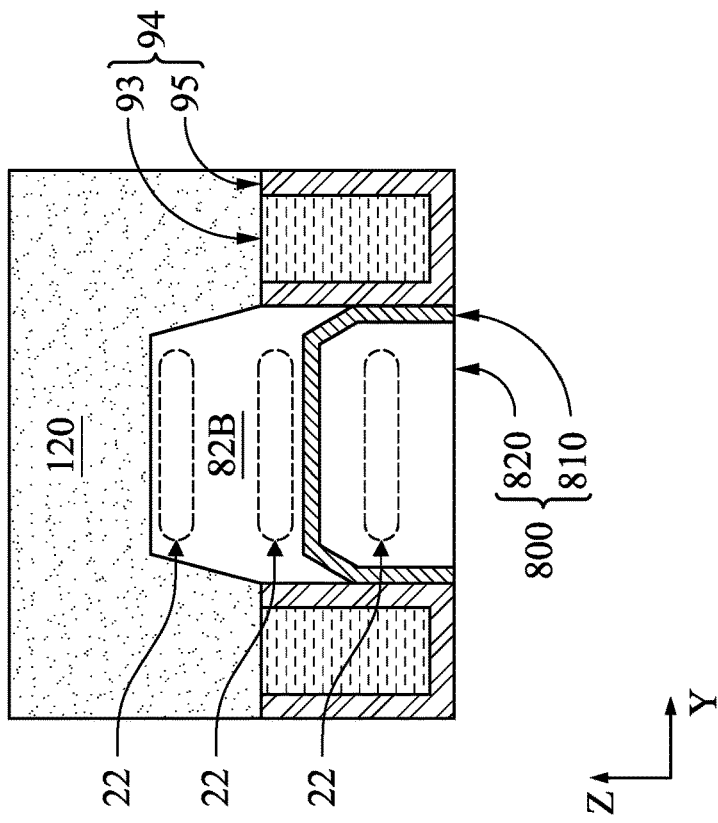

In FIGS. 8A-8D, following removal of the lower source/drain features 82A, the dielectric structures 800 are formed in the openings 78, corresponding to act 1700 of FIG. 13. The dielectric structure 800 may be a monolayer or may include multiple layers. For example, as shown in FIG. 8A, the liner layer 810 may be formed as a conformal layer on exposed surfaces of the fin 32, the upper source/drain features 82B, the inner spacers 74, and any exposed channels 22. As shown in FIGS. 8C and 8D, the liner layer 810 is formed as a conformal layer on exposed surfaces of the isolation regions 36 and optionally on exposed surfaces of the liner layer 95 (e.g., the liner layer 810 may not be in contact with the liner layer 95 in FIG. 8D). In some embodiments, the liner layer 810 is a dielectric layer deposited by a suitable deposition operation, such as a PVD, CVD, ALD or the like. The liner layer 810 may be or include SiO, SiOCN, SiON, SiN or the like. The liner layer 810 may be formed to a thickness of about 3 nm to 5 nm. In some embodiments, the liner layer 810 is a nitrogen-containing material, such as SiN, SiOCN, or the like. Following formation of the liner layer 810, the core layer 820 may be formed on the liner layer 810. The core layer 820 may be or include SiO, SiOCN, SiON, SiN or the like. The core layer 820 may include a different material than that of the liner layer 810. In some embodiments, one or more layers intervene between the liner layer 810 and the core layer 820. In some embodiments, as illustrated in FIG. 1B, the dielectric structures 800 include a dielectric block 840 that is a monolayer. In some embodiments, the upper surface of the core layer 820 may be at a level above, at, or below the upper surfaces of the isolation regions 36.

In FIGS. 9A-9D, following formation of the dielectric structures 800, an optional second thinning or removal operation is performed to remove the fin 32 and portions of the dielectric structures 800 below the bottom surface of the gate structure 200. The optional second thinning or removal operation may also be referred to as a de-mesa operation. In some embodiments, the optional second thinning or removal operation may be or include a CMP, a grind, an etch or the like. The optional second thinning or removal operation may stop on the gate structure 200, the inner spacer 74, or both.

Following the optional second thinning or removal operation, lower surfaces of the gate structure 200, the inner spacers 74 and the dielectric structures 800 may be substantially coplanar. In some embodiments, the liner layer 810 of the nanostructure device 20F is completely removed. In some embodiments, the liner layer 810 is trimmed (e.g., partially removed). In some embodiments, the horizontal portion of the liner layer 810 in contact with the upper source/drain feature 82B is substantially or completely intact following the optional second thinning or removal operation. In some embodiments, the isolation regions 36 are removed or completely removed by the second thinning operation.

In FIGS. 10A-10D, following thinning or removal of the fin 32 and portions of the dielectric structures 800 below the bottom surface of the gate structure 200, the dielectric layer 830 is formed on exposed surfaces of the gate structure 200, the inner spacers 74, the dielectric structures 800, the hybrid fins 94, and the upper source/drain features 82B if exposed. The dielectric layer 830 may be an etch stop layer. Formation of the dielectric layer 830 may include a deposition operation, such as a PVD, a CVD, and ALD or the like. The dielectric layer 830 may be or include SiO, SiOCN, SiON, SiN, or the like. Following formation of the dielectric layer 830, backside circuitry, electrical interconnection structures, or both may be formed on the dielectric layer 830. For example, a backside via may be formed through the dielectric structure 800 and the dielectric layer 830 to form electrical connection to the upper source/drain feature 82B from the backside of the nanostructure device (e.g., the nanostructure device 20E).

Embodiments may provide advantages. Dielectric structures 800 are formed from a backside of the wafer for depopulation of channels 22. On the same wafer or die in both N-FET and P-FET regions, depopulation of the channels 22 is accomplished without P-FET stress loss due to dislocations in the upper source/drain features 82B. As such, stress loss is reduced, and different nanostructure devices may have different numbers of enabled (or disabled) channels 22.

In accordance with at least one embodiment, a method includes: forming a first device on a substrate, including: forming a vertical stack of semiconductor layers over the substrate; forming a sacrificial gate structure that wraps around a portion of the vertical stack; forming first openings adjacent to the sacrificial gate structure by recessing the vertical stack; forming a first epitaxial layer in the first openings; forming a second epitaxial layer in the first openings on the first epitaxial layer; removing the sacrificial gate structure; forming a gate structure that wraps around the semiconductor layers; exposing the first epitaxial layer by thinning the substrate from a backside of the substrate; forming second openings by recessing the first epitaxial layer; and forming a dielectric structure in the second openings.

In accordance with at least one embodiment, a device includes a vertical stack of semiconductor nanostructures, a gate structure, a first epitaxial region and a dielectric structure. The gate structure wraps around the semiconductor nanostructures. The first epitaxial region laterally abuts a first semiconductor nanostructure of the semiconductor nanostructures. The dielectric structure laterally abuts a second semiconductor nanostructure of the semiconductor nanostructures and vertically abuts the first epitaxial region.

In accordance with at least one embodiment, a device includes a first device and a second device laterally offset from the first device. The first device includes: a first vertical stack of first nanostructures; a first gate structure that wraps around the first nanostructures; a first epitaxial region that laterally abuts the first nanostructures; and a first dielectric structure that laterally abuts the first nanostructures and extends to a first level above a first number of the first nanostructures. The second device includes: a second vertical stack of second nanostructures; a second gate structure that wraps around the second nanostructures; and a second epitaxial region that laterally abuts the second nanostructure. The device further includes a second dielectric structure that laterally abuts the second nanostructures and extends to a second level above a second number of the second nanostructures, the second number being different than the first number.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first device on a substrate, including:
   forming a vertical stack of semiconductor layers over the substrate;
   forming a sacrificial gate structure that wraps around a portion of the vertical stack;
   forming first openings adjacent to the sacrificial gate structure by recessing the vertical stack;
   forming a first epitaxial layer in the first openings;
   forming a second epitaxial layer in the first openings on the first epitaxial layer;
   removing the sacrificial gate structure;
   forming a gate structure that wraps around the semiconductor layers;
   exposing the first epitaxial layer by thinning the substrate from a backside of the substrate;
   forming second openings by recessing the first epitaxial layer; and
   forming a dielectric structure in the second openings.

2. The method of claim 1, wherein the first and second epitaxial layers are formed in situ.

3. The method of claim 1, wherein the first epitaxial layer is formed substantially free of dopants.

4. The method of claim 1, wherein dopant concentration in the second epitaxial layer is higher than that in the first epitaxial layer.

5. The method of claim 1, wherein the removing the sacrificial gate structure precedes the removing the first epitaxial layer.

6. The method of claim 1, further comprising:
   disabling at least one of the semiconductor layers by the forming the dielectric structure.

7. The method of claim 6, further comprising:
   disabling semiconductor layers of a second device on the substrate, the second device having a different number of semiconductor layers disabled than are disabled in the first device.

8. The method of claim 1, wherein the forming a dielectric structure includes:

forming a liner layer; and
forming a core layer on the liner layer.

9. The method of claim 1, further comprising forming a dielectric layer from the backside, the dielectric layer covering the dielectric structure.

10. The method of claim 1, wherein the forming second openings includes:
forming the second openings to a level that has an offset from a topmost disabled sheet of the semiconductor layers, the offset being in a range of about 2 nanometers to about 5 nanometers.

11. A device, comprising:
a vertical stack of semiconductor nanostructures;
a gate structure that wraps around the semiconductor nanostructures;
a first epitaxial region laterally abutting a first semiconductor nanostructure of the semiconductor nanostructures; and
a dielectric structure that laterally abuts a second semiconductor nanostructure of the semiconductor nanostructures and vertically abuts the first epitaxial region.

12. The device of claim 11, wherein the dielectric structure includes:
a liner layer on surfaces of the second semiconductor nanostructure and the first epitaxial region; and
a core layer on the liner layer.

13. The device of claim 12, wherein the liner layer has thickness in a range of about 3 nanometers to about 5 nanometers.

14. The device of claim 12, wherein a first cross-sectional profile of the liner layer is U-shaped.

15. The device of claim 14, wherein a second cross-sectional profile of the liner layer includes tapered corners, the second cross-sectional profile being substantially perpendicular to the first cross-sectional profile.

16. The device of claim 12, further comprising:
a dielectric layer in contact with the liner layer, the core layer and the gate structure.

17. The device of claim 11, further comprising:
an inner spacer laterally between the gate structure and the dielectric structure.

18. A device, comprising:
a first device including:
a first vertical stack of first nanostructures;
a first gate structure that wraps around the first nanostructures;
a first epitaxial region that laterally abuts the first nanostructures; and
a first dielectric structure that laterally abuts the first nanostructures and extends to a first level above a first number of the first nanostructures; and
a second device laterally offset from the first device, the second device including:
a second vertical stack of second nanostructures;
a second gate structure that wraps around the second nanostructures;
a second epitaxial region that laterally abuts the second nanostructures; and
a second dielectric structure that laterally abuts the second nanostructures and extends to a second level above a second number of the second nanostructures, the second number being different than the first number.

19. The device of claim 18, wherein:
the first epitaxial region abuts at least three of the first nanostructures; and
the second epitaxial region abuts two or fewer of the second nanostructures.

20. The device of claim 18, further comprising:
backside circuitry electrically connected to the first epitaxial region through the first dielectric structure.

* * * * *